United States Patent
Kato et al.

(10) Patent No.: US 12,537,163 B2
(45) Date of Patent: Jan. 27, 2026

(54) MULTI-CHARGED PARTICLE BEAM WRITING APPARATUS, AND MULTI-CHARGED PARTICLE BEAM WRITING METHOD

(71) Applicant: NuFlare Technology, Inc., Yokohama (JP)

(72) Inventors: Yasuo Kato, Yokohama (JP); Ryoh Kawana, Yokohama (JP); Masao Hayami, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 462 days.

(21) Appl. No.: 18/158,570

(22) Filed: Jan. 24, 2023

(65) Prior Publication Data

US 2023/0187172 A1    Jun. 15, 2023

Related U.S. Application Data

(63) Continuation of application No. PCT/JP2021/018381, filed on May 14, 2021.

(30) Foreign Application Priority Data

Aug. 6, 2020  (JP) ................. 2020-134199

(51) Int. Cl.
*H01J 37/09* (2006.01)
*G03F 7/20* (2006.01)
(Continued)

(52) U.S. Cl.
CPC ........ *H01J 37/3045* (2013.01); *G03F 7/2059* (2013.01); *H01J 37/3177* (2013.01);
(Continued)

(58) Field of Classification Search
CPC .. H01J 37/3045; H01J 37/3177; H01J 37/045; H01J 37/09; H01J 2237/0453;
(Continued)

(56) References Cited

U.S. PATENT DOCUMENTS

| 9,601,315 B2 | 3/2017 | Kawana et al. |
| 9,947,509 B2 | 4/2018 | Matsumoto |

(Continued)

FOREIGN PATENT DOCUMENTS

| CN | 1606130 A | 4/2005 |
| JP | 2016-103557 A | 6/2016 |

(Continued)

OTHER PUBLICATIONS

Office Action issued Oct. 20, 2025 in Chinese Patent Application No. 202180047071.5, with computer generated English translation, citing Documents 1-3 therein.

(Continued)

*Primary Examiner* — Sean M Luck
(74) *Attorney, Agent, or Firm* — Oblon, McClelland, Maier & Neustadt, L.L.P.

(57) ABSTRACT

A multi-charged particle beam writing apparatus includes a beam forming mechanism to form multi-charged-particle-beams, a block region forming circuit to form plural block regions from an irradiation region of the multi-charged-particle-beams formed by combining plural sub-regions each surrounded by a beam, being different from each other, and plural other beams adjacent to the beam in the multi-charged-particle-beams, and a writing mechanism to perform, using the multi-charged-particle-beams, multiple writing such that irradiation of each block region of the plural block regions is at least performed by any one of writing processing of the multiple writing, and such that each writing processing of the multiple writing is performed to (Continued)

write a writing region of a target object in a manner of covering the writing region without overlapping by, using one of the plural block regions, irradiation of the one of the plural block regions.

10 Claims, 19 Drawing Sheets

(51) Int. Cl.
    *H01J 37/304*     (2006.01)
    *H01J 37/317*     (2006.01)
    *H01J 37/04*     (2006.01)

(52) U.S. Cl.
    CPC ............. *H01J 37/045* (2013.01); *H01J 37/09* (2013.01); *H01J 2237/0437* (2013.01); *H01J 2237/0453* (2013.01); *H01J 2237/31761* (2013.01)

(58) Field of Classification Search
    CPC .... H01J 2237/0437; H01J 2237/31761; G03F 7/2059
    See application file for complete search history.

(56) References Cited

U.S. PATENT DOCUMENTS

| | | |
|---|---|---|
| 10,134,562 B2 | 11/2018 | Kato et al. |
| 10,460,908 B2 | 10/2019 | Matsumoto |
| 2014/0229904 A1* | 8/2014 | Fujimura ............... G03F 7/2063 716/54 |
| 2020/0135428 A1 | 4/2020 | Matsumoto |
| 2021/0027987 A1 | 1/2021 | Matsumoto et al. |

FOREIGN PATENT DOCUMENTS

| | | |
|---|---|---|
| JP | 2016-119423 A | 6/2016 |
| JP | 2016-225357 A | 12/2016 |
| JP | 2018-182189 | 11/2018 |
| JP | 2019-29575 A | 2/2019 |
| JP | 2021-22731 A | 2/2021 |
| KR | 10-2020-0049622 | 5/2020 |
| TW | 202022503 A | 6/2020 |

OTHER PUBLICATIONS

International Search Report issued Jul. 20, 2021 in PCT/JP2021/018381 filed May 14, 2021, 3 pages.

Taiwanese Office Action issued on Jan. 13, 2022 in Taiwanese Patent Application No. 110118061, (with Machine Generated English Translation), 9 pages.

* cited by examiner

| 25 | 17 | 9 | 1 |
|----|----|----|----|
| 25 | 17 | 9 | 1 |
| 25 | 17 | 9 | 1 |
| 25 | 17 | 9 | 1 |
FIG.7
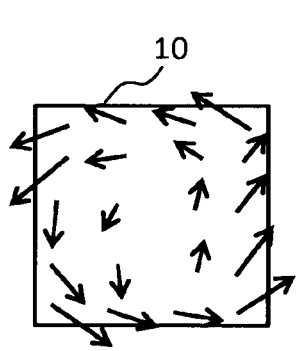 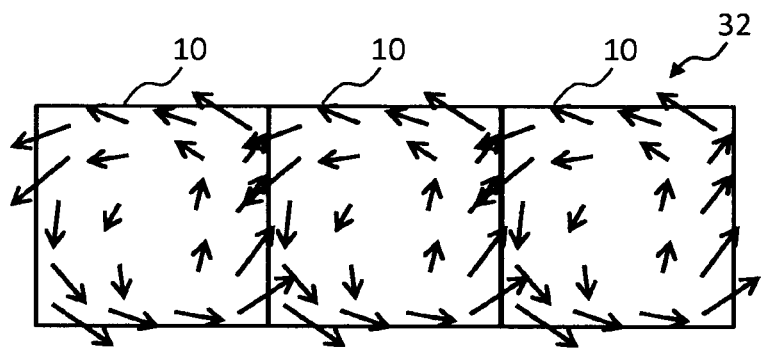
FIG.8A          FIG.8B

SUBSTANTIAL POSITION DEVIATION AMOUNT IS REDUCED

REFERENCE: X: 0nm, Y: 0nm        X: + 5nm, Y: + 5nm
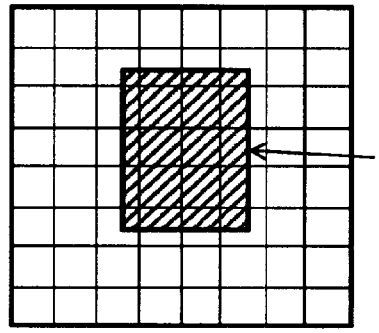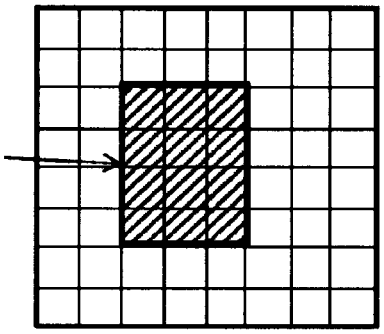
BITMAP MESH        FIG.21A ONE CASE: RANGE OF BEAM POSITION DEVIATION AMOUNT
OF WHOLE BEAM ARRAY FROM -10 nm TO +10 nm IN X AND Y DIRECTIONS X: -10nm ~ 0nm
Y: -10nm ~ 0nm X: -10nm ~ 0nm
Y: 0nm ~ +10nm X: 0nm ~ +10nm
Y: -10nm ~ 0nm X: 0nm ~ +10nm
Y: 0nm ~ +10nm

REDUCE MAXIMUM VALUE OF SUBSTANTIAL POSITION DEVIATION AMOUNT

X: -5nm ~ +5nm
Y: -5nm ~ +5nm

X: -5nm ~ +5nm
Y: -5nm ~ +5nm

X: -5nm ~ +5nm
Y: -5nm ~ +5nm

X: -5nm ~ +5nm
Y: -5nm ~ +5nm

MULTI-CHARGED PARTICLE BEAM WRITING APPARATUS, AND MULTI-CHARGED PARTICLE BEAM WRITING METHOD

CROSS-REFERENCE TO RELATED APPLICATION

This application is a continuation application based upon and claims the benefit of priority from prior Japanese Patent Application No. 2020-134199 (application number) filed on Aug. 6, 2020 in Japan, and International Application PCT/JP2021/018381, the International Filing Date of which is May 14, 2021. The contents described in JP2020-134199 and PCT/JP2021/018381 are incorporated herein by reference.

BACKGROUND OF THE INVENTION

Field of the Invention

Embodiments of the present invention relate to a multi-charged particle beam writing apparatus and a multi-charged particle beam writing method, and, for example, relate to a method of reducing the range of a correction amount for correcting a pattern position deviation in multiple beam writing.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. Thus, the electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multiple beam system forms multiple beams by letting portions of an electron beam emitted from an electron gun individually pass through a corresponding one of a plurality of holes in a mask, performs blanking control for respective formed beams, reduces by an optical system each beam that was not blocked in the blanking process to reduce a mask image, and deflects the reduced beam by a deflector to irradiate a desired position on a target object or "sample".

In multiple beam writing, the dose applied by each beam is controlled based on an irradiation time. Position deviation of a pattern to be written is corrected by modulating the dose (irradiation amount) of each irradiating beam. When performing writing processing for each stripe region obtained by dividing a chip region to be written, the position deviation increases at the border between stripe regions, for example. Then, if the position deviation amount of a pattern increases, the maximum modulation amount of the dose also increases. Since the maximum irradiation time per shot is set to be a time necessary for irradiating the maximum dose according to the maximum modulation amount, if the maximum modulation amount increases, the maximum irradiation time per shot needs to be increased (lengthened). As a result, a problem occurs that the writing time increases.

There is disclosed a method in which, for example, 4×4 pixels on a target object is treated as one pixel block, and then, for each block, the position and shape of the region in writing data for writing the pixel block concerned is corrected, thereby correcting a position deviation of the pixel block (e.g., refer to Japanese Patent Application Laid-open (JP-A) No. 2016-225357).

BRIEF SUMMARY OF THE INVENTION

According to one aspect of the present invention, a multi-charged particle beam writing apparatus includes
  a beam forming mechanism configured to form multiple charged particle beams;
  a block region forming circuit configured to form a plurality of block regions from an irradiation region of the multiple charged particle beams which is formed by combining a plurality of sub-regions each surrounded by a beam, being different from each other, and a plurality of other beams adjacent to the beam in the multiple charged particle beams; and
  a writing mechanism configured to perform, using the multiple charged particle beams, multiple writing such that irradiation of each block region of the plurality of block regions is at least performed by any one of writing processing of the multiple writing, and such that each writing processing of the multiple writing is performed to write a writing region of a target object in a manner of covering the writing region without overlapping by, using one of the plurality of block regions, irradiation of the one of the plurality of block regions.

According to another aspect of the present invention, a multi-charged particle beam writing method includes
  forming multiple charged particle beams;
  forming a plurality of block regions from an irradiation region of the multiple charged particle beams which is formed by combining a plurality of sub-regions each surrounded by a beam, being different from each other, and a plurality of other beams adjacent to the beam of the multiple charged particle beams; and
  performing, using the multiple charged particle beams, multiple writing such that irradiation of each block region of the plurality of block regions is at least performed by any one of writing processing of the multiple writing, and such that each writing processing of the multiple writing is performed to write a writing region of a target object in a manner of covering the writing region without overlapping by, using one of the plurality of block regions, irradiation of the one of the plurality of block regions.

BRIEF DESCRIPTION OF THE DRAWINGS

FIG. 7 is a diagram showing an example of a beam irradiating a sub-irradiation region according to the first embodiment;

FIGS. 8A and 8B are illustrations for explaining a position deviation state according to a comparative example of the first embodiment;

FIGS. 21A to 21C are illustrations showing examples of a bitmap according to the fifth embodiment.

DETAILED DESCRIPTION OF THE INVENTION

The embodiments below describe an apparatus and method that can reduce the maximum position deviation amount of a pattern in multiple beam writing.

The embodiments below describe a configuration in which an electron beam is used as an example of a charged particle beam. The charged particle beam is not limited to the electron beam, and other charged particle beam such as an ion beam may also be used.

First Embodiment

Figure 1:
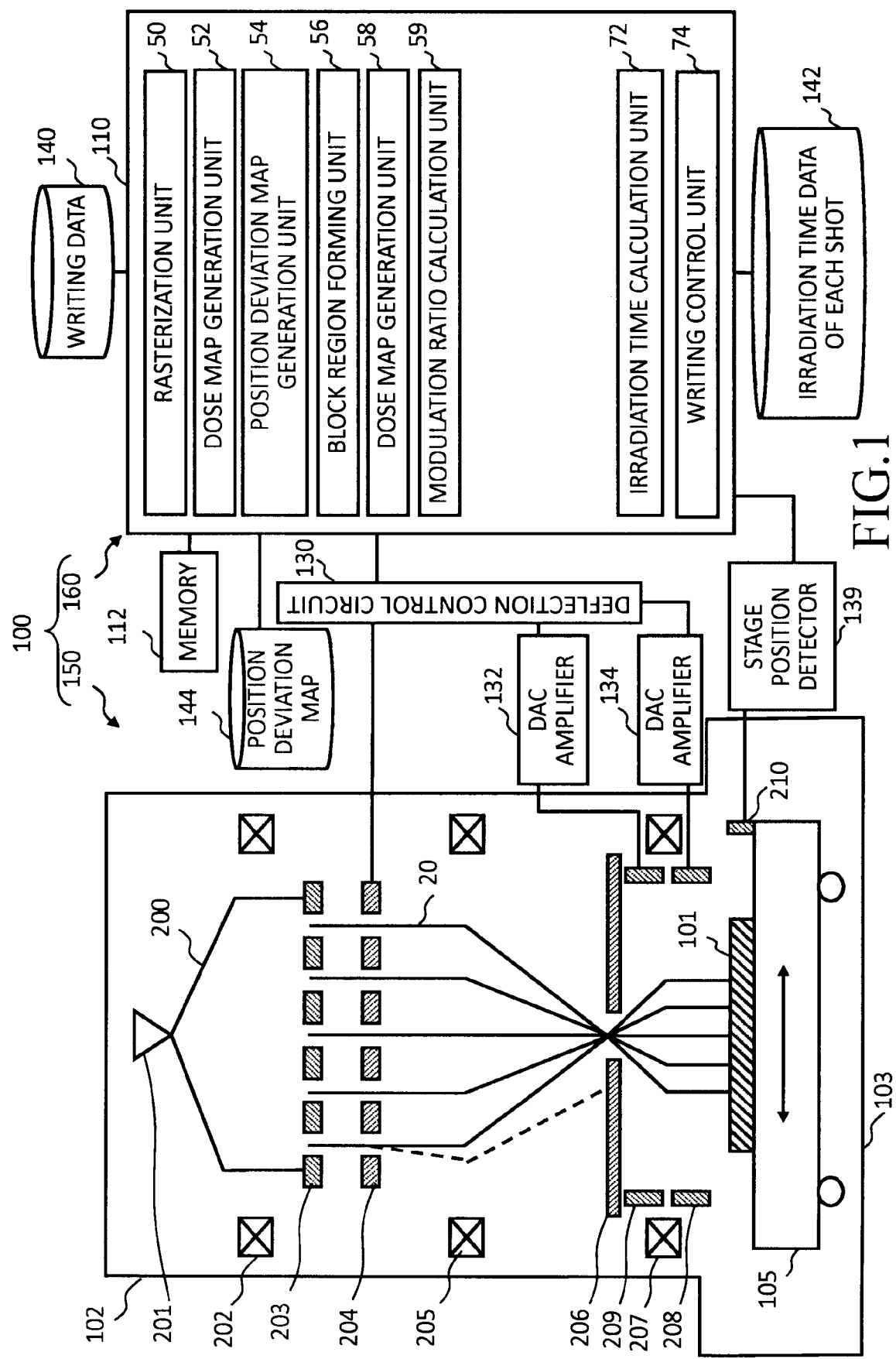
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi-charged particle beam writing apparatus. The writing mechanism 150 includes an electron beam column 102 (multi-electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, an XY stage 105 is disposed. On the XY stage 105, there is placed a target object or "sample" 101 such as a mask blank, on which resist has been applied, serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105 is placed.

The control system circuit 160 includes a control computer 110, a memory 112, a deflection control circuit 130, DAC (digital-analog converter) amplifier units 132 and 134, a stage position detector 139, and storage devices 140, 142, and 144 such as magnetic disk drives. The control computer 110, the memory 112, the deflection control circuit 130, the stage position detector 139, and the storage devices 140, 142, and 144 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and controlled by the deflection control circuit 130 through a corresponding amplifier of the DAC amplifier unit 134 disposed for each electrode. The deflector 209 is composed of at least four electrodes (or "poles"), and controlled by the deflection control circuit 130 through a corresponding amplifier of the DAC amplifier unit 132 disposed for each electrode. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light.

In the control computer 110, there are arranged a rasterization unit 50, a dose map generation unit 52, a position deviation map generation unit 54, a block region forming unit 56, a dose map generation unit 58, a modulation rate calculation unit 59, an irradiation time calculation unit 72, and a writing control unit 74. Each of the " . . . units" such as the rasterization unit 50, the dose map generation unit 52, the position deviation map generation unit 54, the block region forming unit 56, the dose map generation unit 58, the modulation rate calculation unit 59, the irradiation time calculation unit 72, and the writing control unit 74 includes processing circuitry. The processing circuitry includes, for example, an electric circuit, computer, processor, circuit board, quantum circuit, or semiconductor device. Each " . . . unit" may use common processing circuitry (the same processing circuitry), or different processing circuitry (separate processing circuitry). Information input/output to/from the rasterization unit 50, the dose map generation unit 52, the position deviation map generation unit 54, the block region forming unit 56, the dose map generation unit 58, the modulation rate calculation unit 59, the irradiation time calculation unit 72, and the writing control unit 74, and information being operated are stored in the memory 112 each time.

Writing data is input from the outside of the writing apparatus 100, and stored in the storage device 140. The writing data generally defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
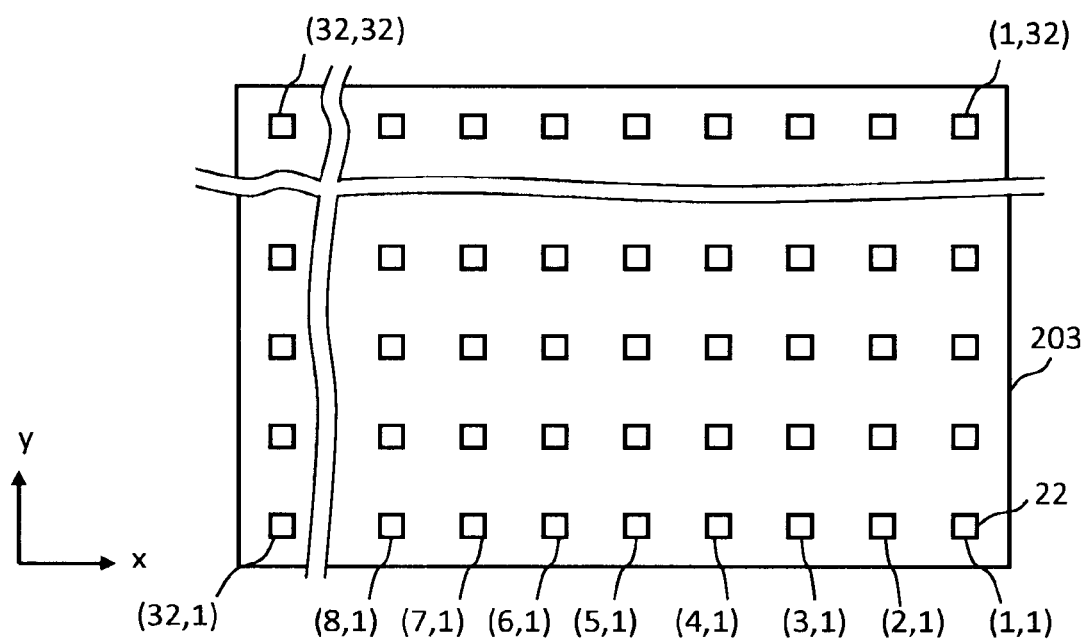
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 32×32, that is 32 (rows of holes arrayed in the y direction)×32 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms multiple beams 20. Specifically, the multiple beams 20 are formed by letting portions of the electron beam 200 individually pass through a corresponding one of a plurality of holes 22.

Figure 3:
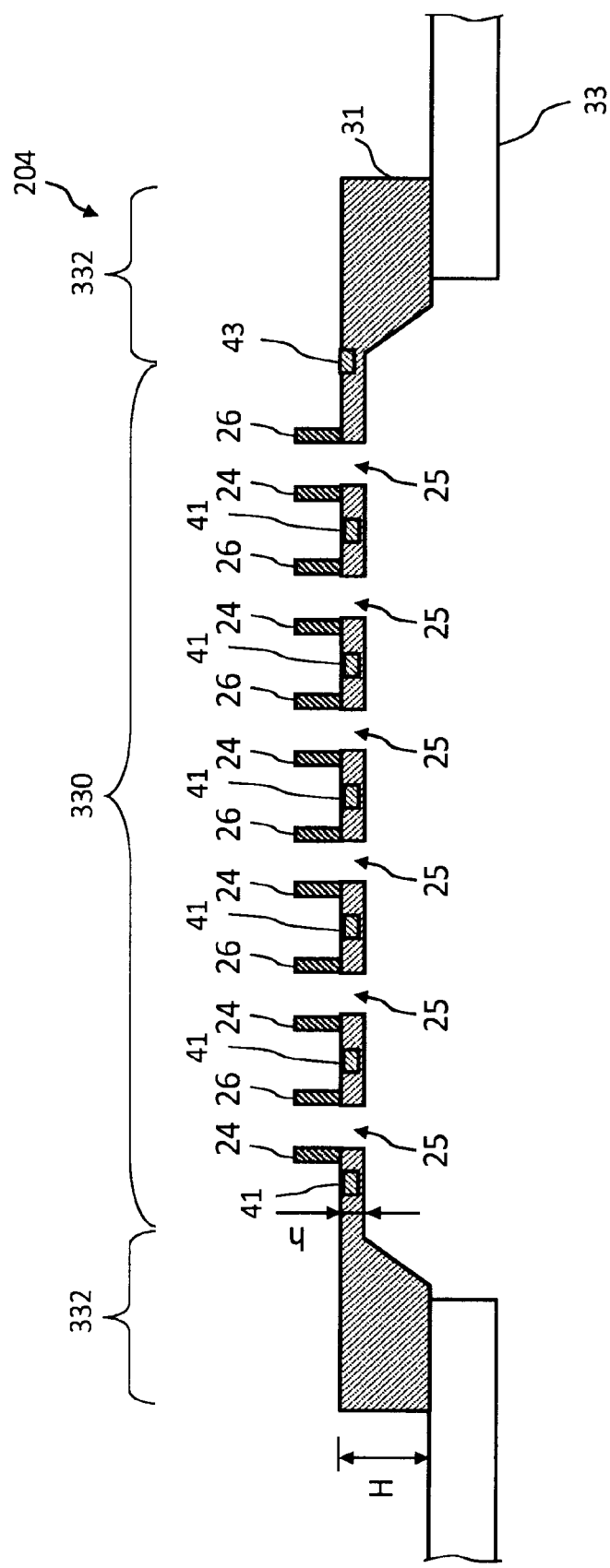
FIG. 3 is a sectional view showing a configuration of a blanking aperture array mechanism according to the first embodiment.

FIG. 3 is a sectional view showing a configuration of a blanking aperture array mechanism according to the first embodiment. With regard to the structure of the blanking aperture array mechanism 204, a semiconductor substrate 31 made of silicon, etc. is placed on a support table 33 as shown in FIG. 3. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 2. In other words, in the membrane region 330 of the substrate 31, there are formed a plurality of passage holes 25, in an array state, through each of which a corresponding one of the multiple electron beams 20 passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 3, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330, inside the substrate 31, there is arranged a control circuit 41 (logic circuit) which applies a deflection voltage to the control electrode 24 for the passage hole 25 concerned. The counter electrode 26 for each beam is grounded.

To each control circuit 41, n-bit (e.g., 10-bit) parallel lines for control signals are connected. In addition to the n-bit parallel lines for controlling signals, lines for a clock signal, a read signal, a shot signal, a power supply, and the like are connected to each control circuit 41. An individual blanking mechanism composed of the control electrode 24, the counter electrode 26, and the control circuit 41 is configured for each of the multiple beams. A plurality of control circuits 41 formed in an array in the membrane region 330 are grouped, for example, per row or per column, and the control circuits 41 in each group are connected in series. Then, the pad 43 arranged for each group sends a signal to the control circuits 41 in the group concerned. Specifically, a shift register (not shown) is arranged in each control circuit 41, and shift registers in the control circuits 41 for beams in the same row, for example, in p×q, for example, multiple beams are connected in series. For example, control signals for beams in the same row in the p×q multiple beams are transmitted in series, and, a control signal for each beam is stored in a corresponding control circuit 41 by p-times clock signals, for example.

In the logic circuit 41, an amplifier (not shown) (an example of a switching circuit) is arranged. The amplifier is connected to a positive potential (Vdd: blanking potential: first electric potential) (e.g., 5 V) and to a ground potential (GND: second electric potential). The output line (OUT) of the amplifier is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25. In a state where an L electric potential is applied to the input (IN) of the amplifier, the output (OUT) of the amplifier becomes a positive potential (Vdd), and then, a corresponding one of the multiple beams 20 is deflected by an electric field due to a potential difference from the ground potential of the counter electrode 26 so as to be blocked by the limiting aperture substrate 206, and thus it is controlled to be in a beam OFF condition. By contrast, in a state (active state) where an H electric potential is applied to the input (IN) of the amplifier, the output (OUT) of the amplifier becomes a ground potential, and therefore, since there is no potential difference from the ground potential of the counter electrode 26, a corresponding one of the multiple beams 20 is not deflected. Then, by passing through the limiting aperture substrate 206, the beam concerned is controlled to be in a beam ON condition.

The corresponding one of the multiple beams 20, passing through a corresponding passage hole, is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding beam of the multiple beams 20 by an electric potential which is switchable by an amplifier serving as a switching circuit corresponding to each pair. Thus, each of a plurality of blankers performs blanking deflection of a corresponding one of the multiple beams 20 having passed through a plurality of holes 22 (openings) in the shaping aperture array substrate 203.

Next, operations of the writing mechanism 150 of the writing apparatus 100 will be described. The electron beam 200 emitted from the electron gun 201 (emission source) illuminates the whole of the shaping aperture array substrate 203 by the illumination lens 202. As described above, a plurality of rectangular (including square) holes 22 (openings) are formed in the shaping aperture array substrate 203. The region including all of the plurality of holes 22 is irradiated with the electron beam 200. For example, a plurality of rectangular (including square) electron beams (multiple beams 20) are formed by letting portions of the electron beam 200 applied to the positions of a plurality of holes 22 individually pass through a corresponding hole of the plurality of holes 22 of the shaping aperture array substrate 203. The multiple beams 20 individually pass through corresponding blankers (first deflector: individual blanking mechanism) of the blanking aperture array mechanism 204. Each blanker deflects (provides blanking deflection) the electron beam passing therethrough individually.

The multiple beams 20 having passed through the blanking aperture array mechanism 204 are reduced by the reducing lens 205, and travel toward the hole in the center of the limiting aperture substrate 206. Then, the electron beam in the multiple beams 20 which was deflected by the blanker of the blanking aperture array mechanism 204 deviates (shifts) from the hole in the center of the limiting aperture substrate 206 and is blocked by the limiting aperture substrate 206. In contrast, the electron beam which was not deflected by the blanker of the blanking aperture array mechanism 204 passes through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed through the limiting aperture substrate 206 (the whole of the multiple beams 20 having passed) are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 of the shaping aperture array substrate 203 by a desired reduction ratio described above.

Figure 4:
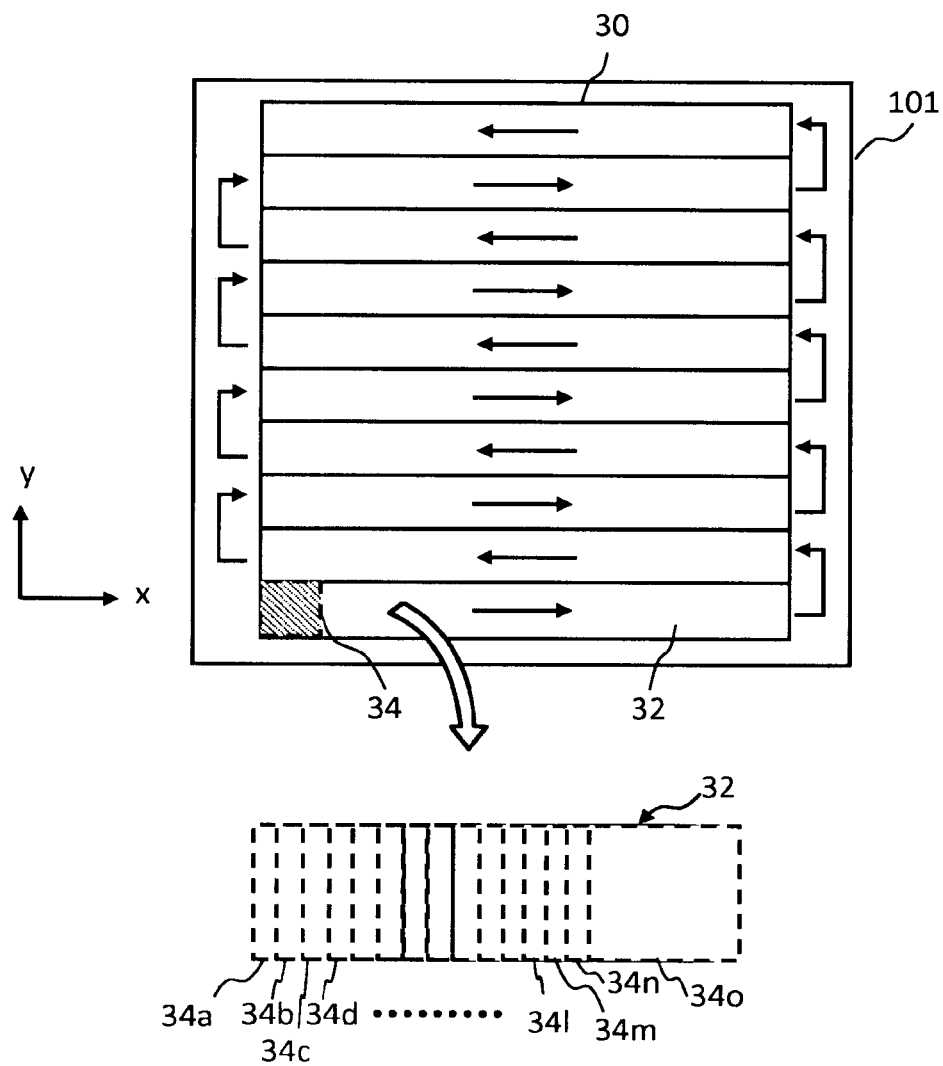
FIG. 4 is a conceptual diagram for explaining an example of a writing operation according to the first embodiment.

FIG. 4 is a conceptual diagram for explaining an example of a writing operation according to the first embodiment. As shown in FIG. 4, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the –x direction, so that the writing may relatively proceed in the x direction. The XY stage 105 is moved, for example, continuously at a constant speed. After writing the first stripe region 32, the stage position is moved in the –y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the –x direction. That is, writing is performed while alternately changing the direction, such as performing writing in the x direction in the third stripe region 32, and in the –x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. When writing each stripe region 32, multiple writing is performed in the same stripe region 32 without shifting the position of the stripe region 32. With respect to multiple writing, besides writing the same stripe region 32 multiple times without shifting the position, there is a way of setting and writing the stripe region 32 of each pass while shifting the position. For example, when performing multiple writing of the same stripe region 32 without shifting the position, the first writing of each pixel is executed as the first pass writing processing, and the second writing of each pixel is executed as the second pass writing processing.

Figure 5:
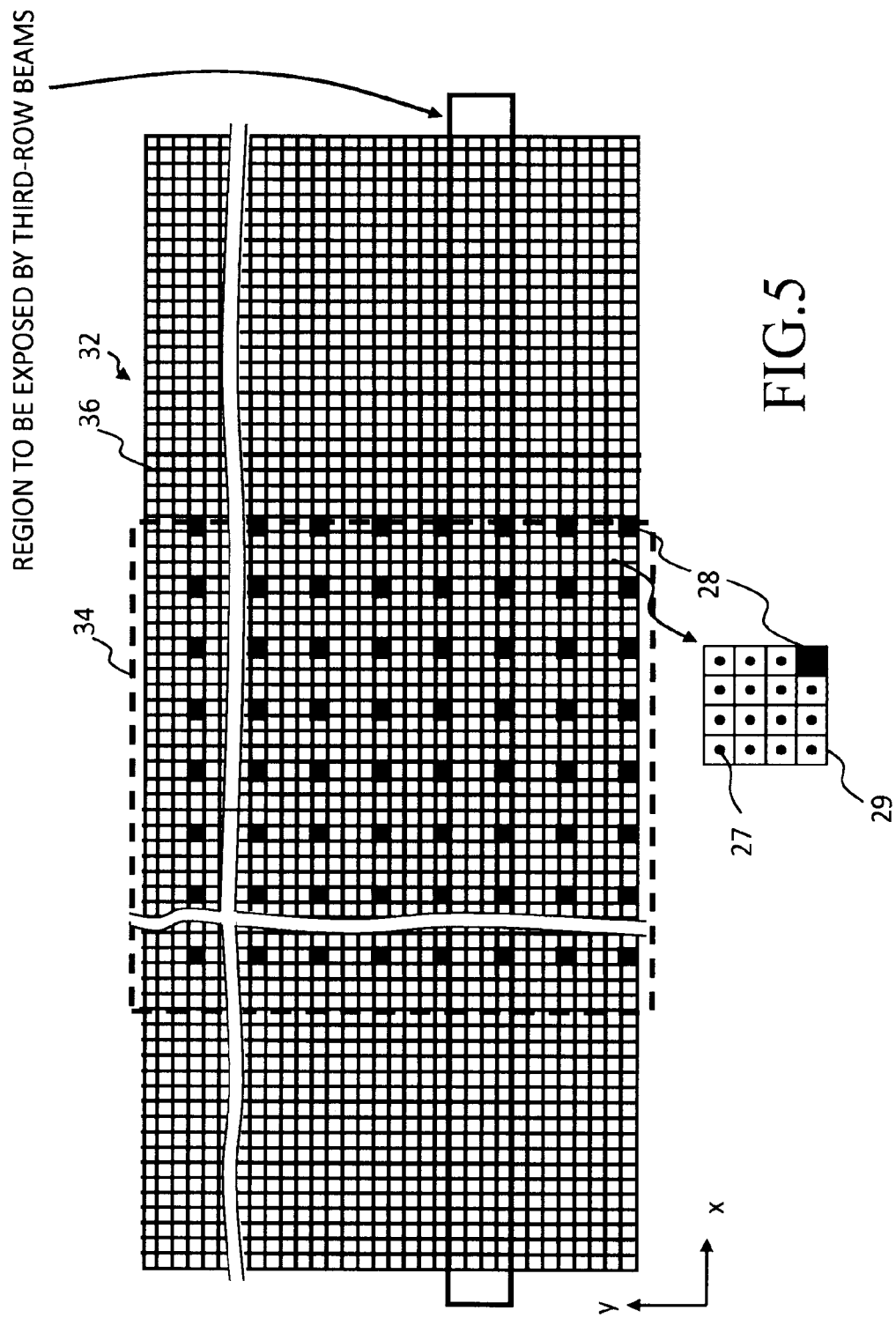
FIG. 5 is an illustration showing an example of an irradiation region of multiple beams and a pixel to be written according to the first embodiment.

FIG. 5 is an illustration showing an example of an irradiation region of multiple beams and a pixel to be written (writing target pixel) according to the first embodiment. In FIG. 5, in the stripe region 32, there are set a plurality of control grids 27 (design grids) arranged in a grid form at the beam size pitch of the multiple beams 20 on the surface of the target object 101, for example. Preferably, the control grids 27 are arranged at a pitch of around 10 nm, for example. The plurality of control grids 27 serve as design irradiation positions of the multiple beams 20. The arrangement pitch of the control grid 27 is not limited to the beam size, and may be any size that can be controlled as a deflection position of the deflector 209 regardless of the beam size. Then, a plurality of pixels 36, each of which is centering on each control grid 27, are set by virtually dividing into a mesh form by the same size as that of the arrangement pitch of the control grid 27. Each pixel 36 serves as an irradiation unit region per beam of the multiple beams. FIG. 5 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The irradiation region 34 is a rectangular (including square) region surrounded by the sides in the x and y directions, for example. The x-direction size of the irradiation region 34 can be defined by the value obtained by multiplying the beam pitch (pitch between beams) in the x direction (first direction) of the multiple beams 20 by the number of beams in the x direction. The y-direction size of the irradiation region 34 can be defined by the value obtained by multiplying the beam pitch in the y direction (second direction) of the multiple beams 20 by the number of beams in the y direction. The width of the stripe region 32 is not limited to this. Preferably, the width of the stripe region 32 is n times (n being an integer of one or more) the size of the irradiation region 34. FIG. 5 shows the case where the multiple beams of 32×32 (rows by columns), for example, are simplified to 8×8 (rows by columns) by omitting the middle description with respect to both the x and y directions. Then, in the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 5, one sub-irradiation region 29 is a region surrounded by beam pitches. Therefore, the irradiation region 34 is a region formed by combining a plurality of sub-irradiation regions 29 (sub-region) each surrounded by a beam, being different from each other, and a plurality of other beams adjacent to the beam in the multiple beams. In the case of FIG. 5, each sub-irradiation region 29 is composed of 4×4 pixels.

Figure 6:
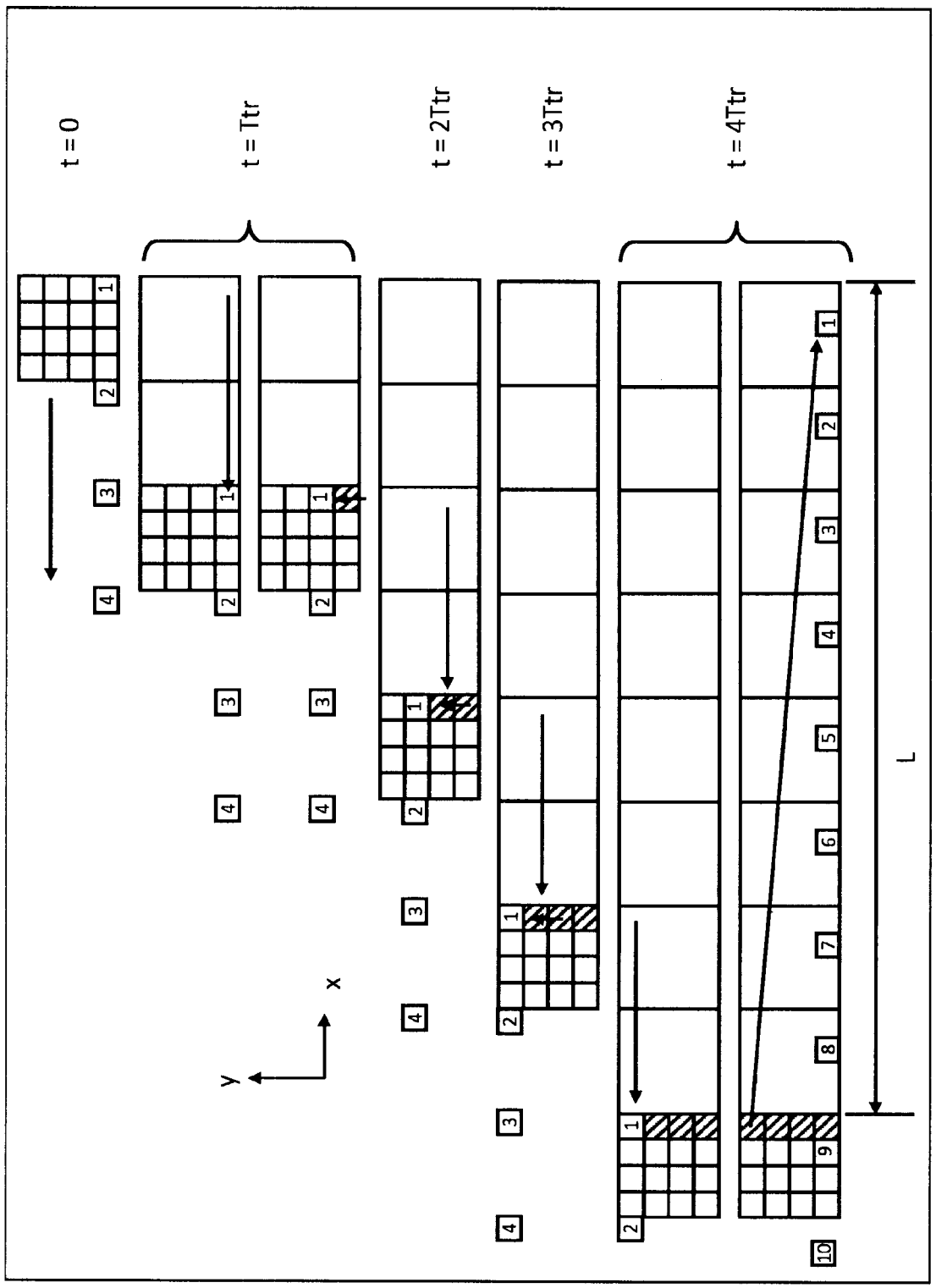
FIG. 6 is an illustration for explaining an example of a writing method of multiple beams according to a comparative example of the first embodiment.

FIG. 6 is an illustration for explaining an example of a writing method of multiple beams according to a comparative example of the first embodiment. FIG. 6 shows a portion of the sub-irradiation region 29 to be written by each beam. FIG. 6 describes the case of the beam (1) at the coordinates (1, 3) shown in FIG. 5. In the case of FIG. 6, while the XY stage 105 moves the distance of eight beam pitches, four pixels are written (exposed). At each shot, each pixel is irradiated with beams during a desired irradiation time controlled to be between 0 and the maximum irradiation time Ttr. The four pixels are written (exposed) during the time between t=0 and t=4 Ttr. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 6, one tracking cycle is executed by writing (exposing) four pixels while the target object 101 on the XY stage 105 moves the distance of eight beam pitches. In the case of FIG. 6, four pixels in the first column from the right are written upward by the beam (1) in order from the one in the bottom row of the sub-irradiation region 29 concerned. During one tracking control, moving between pixels is performed by collectively deflecting the multiple beams 20 by the deflector 209. After the four pixels have been irradiated with beams, the DAC amplifier 134 returns the tracking position to the start position of tracking, where the tracking control was started, by resetting the beam deflection for tracking control. In the example of FIG. 6, when the time becomes t=4 Ttr, tracking of the sub-irradiation region 29 concerned is removed (cancelled), and the beam is swung back to a next target sub-irradiation region 29 shifted by eight beam pitches in the x direction. Although the beam (1) at the coordinates (1, 3) shown in FIG. 5 has been described in the example of FIG. 6, writing is also similarly performed for each sub-irradiation region 29 corresponding to a beam at other coordinates. That is, when the time becomes t=4 Ttr, the beam at coordinates (n, m) completes writing of the pixels in the first column from the right in a corresponding sub-irradiation region 29. For example, the beam (2) at the coordinates (2, 3) completes writing of the pixels in the first column from the right in another sub-irradiation region 29 which is adjacent in the −x direction to the sub-irradiation region 29 for the beam (1) of FIG. 6.

When writing of the pixels in the first column from the right of each sub-irradiation region 29 has been completed, in the next tracking cycle after resetting the tracking, the deflector 209 performs deflection such that the writing position of each corresponding beam is adjusted (shifted) to the control grid 27 at the bottom in the second pixel column from the right of each sub-irradiation region 29. By repeating this operation, while the XY stage 105 moves the distance of 32 (=4×8) beam pitches, the beam irradiation onto all the pixels in each sub-irradiation region 29 has been completed. During writing the stripe region 32, by repeating this operation, the position of the irradiation region 34 is shifted one by one, such as from 34*a* to 34*o* as shown in FIG. 4, to perform writing of the stripe region concerned. In the case of FIG. 6, the sub-irradiation region 29 is composed of 4×4 pixels, but it is not limited thereto. When the sub-irradiation region 29 is composed of n×n pixels, n control grids (n pixels) are written by one tracking operation while the irradiation position is shifted. Thus, writing is performed for each n pixels by a different beam each time in n-time tracking operations, thereby writing all of pixels in one region of n×n pixels.

FIG. 7 is a diagram showing an example of a beam irradiating a sub-irradiation region according to the first embodiment. In the writing sequence explained in the example of FIG. 6, the first beam column from the right in the x direction in the sub-irradiation region 29 is irradiated in the y direction with the beams (1) by the writing mechanism 150. As shown in FIG. 7, the first column from the right is irradiated with the beam (1), the second one is irradiated with the beam (9), the third one with the beam (17), and the fourth one (left end) with the beam (25). That is, the irradiation is performed by the four beams each away from each other by eight beam pitches. The writing sequence is not limited to this, and it may be set such that each sub-irradiation region 29 is irradiated with the same corresponding one beam.

FIGS. 8A and 8B are illustrations for explaining a position deviation state according to a comparative example of the first embodiment. In the writing sequence described in the example of FIG. 6, in a rectangular beam array region 10 on the target object 101, whose size is the same as that of the irradiation region 34 of FIG. 5, all the pixels can be irradiated with the multiple beams 20 while the XY stage 105 moves the distance of 32 beam pitches. In the beam array region 10, position deviation as shown in FIG. 8A may exist. In FIG. 8A, the direction of an arrow indicates the direction of position deviation, and the length of an arrow indicates the amount of position deviation. When writing the stripe region 32, since the operation of the writing sequence explained in the example of FIG. 6 is repeated, the repetition is performed in a manner such that the beam array regions 10 contact with each other on the stripe region 32 as shown in FIG. 8B. Therefore, the position deviation occurring in the beam array region 10 is repeated with a periodicity on the stripe region 32.

With respect to the 32×32 multiple beams 20, the closer to the outer peripheral side the beam is, the more the influence of the electron optical system, such as an aberration, the beam receives, compared with the beam at the center side. Therefore, the closer to the outer peripheral side the beam is, the larger the amount of position deviation at the irradiation position on the target object 101 becomes. For this reason, in the 32×32 multiple beams 20, the more the writing sequence employing a plurality of beams closer to each other irradiating the same sub-irradiation region 29 is used, the more the influence of the position deviation depending on the arrangement position of a beam is received. For example, the writing sequence in which each of all the pixels of the sub-irradiation region 29 is irradiated with a beam having the same arrangement position is most easily affected by position deviation dependent on the beam arrangement position. In the writing sequence described with reference to the example of FIG. 6, since each sub-irradiation region 29 is irradiated with four beams each away from each other by eight beam pitches, position deviation depending on each position of the beam array region 10 still occurs although the influence of position deviation depending on a beam arrangement position in the x direction is averaged. The position deviation amount of the beam array region 10 is different according to the contents of the writing sequence, and it has a tendency of easily increasing at the outer peripheral portion. Therefore, the amount of position deviation particularly increases at the border between the beam array regions 10 shown in FIG. 8B. For example, in the case where a position deviation of $+\Delta$ occurs at one end of the beam array region 10 and another position deviation of $-\Delta$ occurs at the other end, a position deviation of $(+\Delta)-(-\Delta)=2\Delta$ occurs at the border between the two beam array regions 10. The amount of position deviation on the target object 101 can be corrected by modulating the dose (irradiation amount) of each beam irradiating the position and/or its neighborhood.

However, as described above, if the amount of position deviation of a pattern increases, the maximum modulation amount of the dose also increases. For example, modulating several 100% (e.g., 300%) of the reference value (base dose) of the dose becomes needed. Since the maximum irradiation time Ttr per shot is set to be a time required for applying the maximum dose according to the maximum modulation amount, if the maximum modulation amount increases, it becomes necessary to lengthen the maximum irradiation time Ttr per shot. The shot cycle of the multiple beams 20 is set to be a value obtained by adding, for example, a settling time of the DAC amplifier 132 to the maximum irradiation time Ttr. Accordingly, when the maximum irradiation time Ttr increases, the shot cycle becomes long in accordance with the increased Ttr, and therefore, there is a problem that the writing time increases. Then, according to the first embodiment, the maximum of the position deviation amount is decreased. For this reason, the beam array region 10 is divided into a plurality of block regions.

Figure 9:
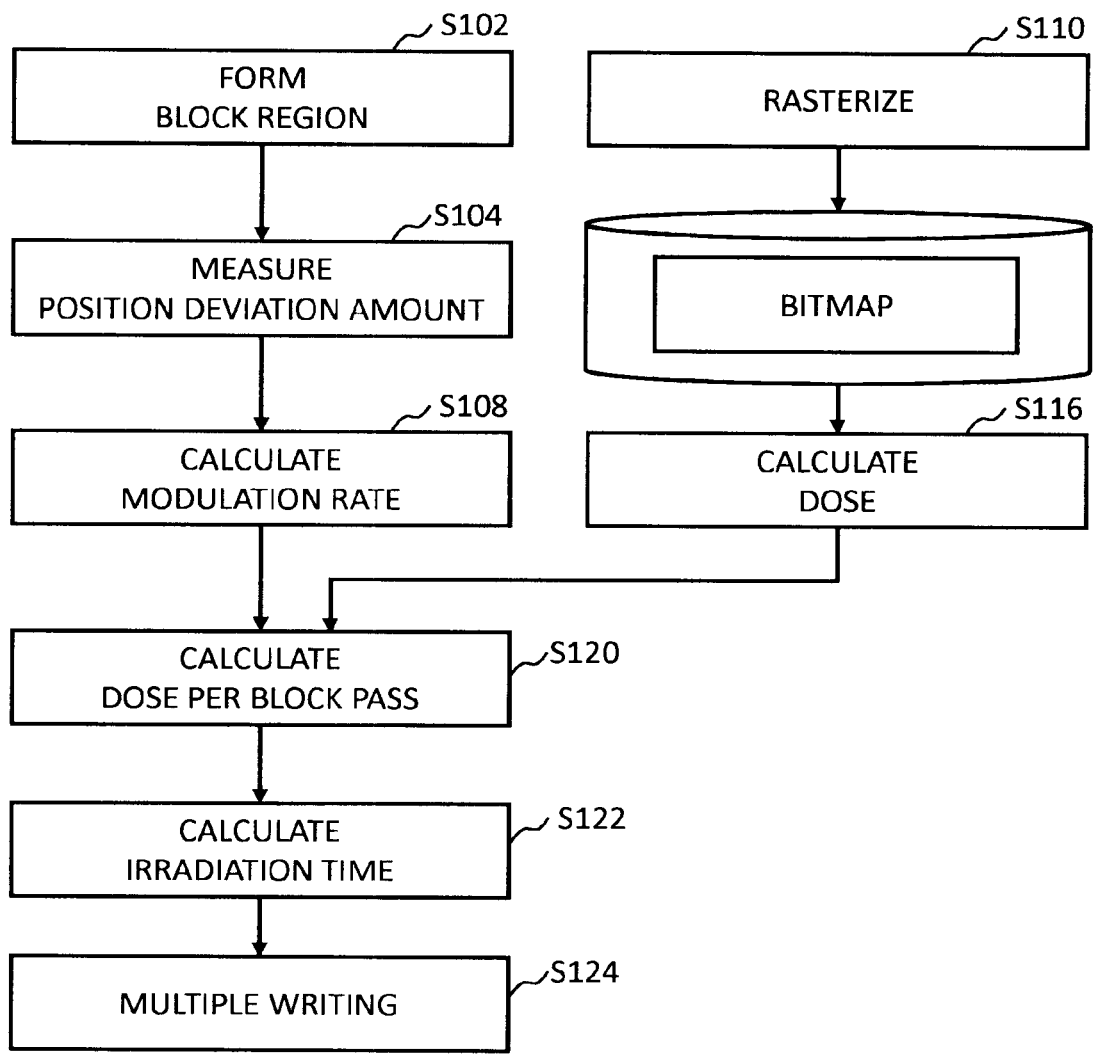
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: a block region forming step (S102), a position deviation amount measuring step (S104), a modulation rate calculation step (S108), a rasterization step (S110), a dose calculation step (S116), a dose calculation step (S120) for each block pass, an irradiation time calculation step (S122), a multiple writing step (S124), and a series of steps to say and re carried out.

In the block region forming step (S102), the block region forming unit 56 forms a plurality of block regions from the irradiation region of the multiple beams 20 which is formed by combining a plurality of sub-irradiation regions 29 (sub-region) each surrounded by a beam, being different from each other, and a plurality of other beams adjacent to the beam in the multiple beams 20. Specifically, the block region forming unit 56 forms a plurality of block regions from the beam array region 10 (rectangular region) surrounded by the x-direction side whose size is obtained by multiplying the number of x-direction beams of the multiple beams 20 by the x-direction beam pitch, and the y-direction side whose size is obtained by multiplying the number of y-direction beams by the y-direction beam pitch.

Figure 10:
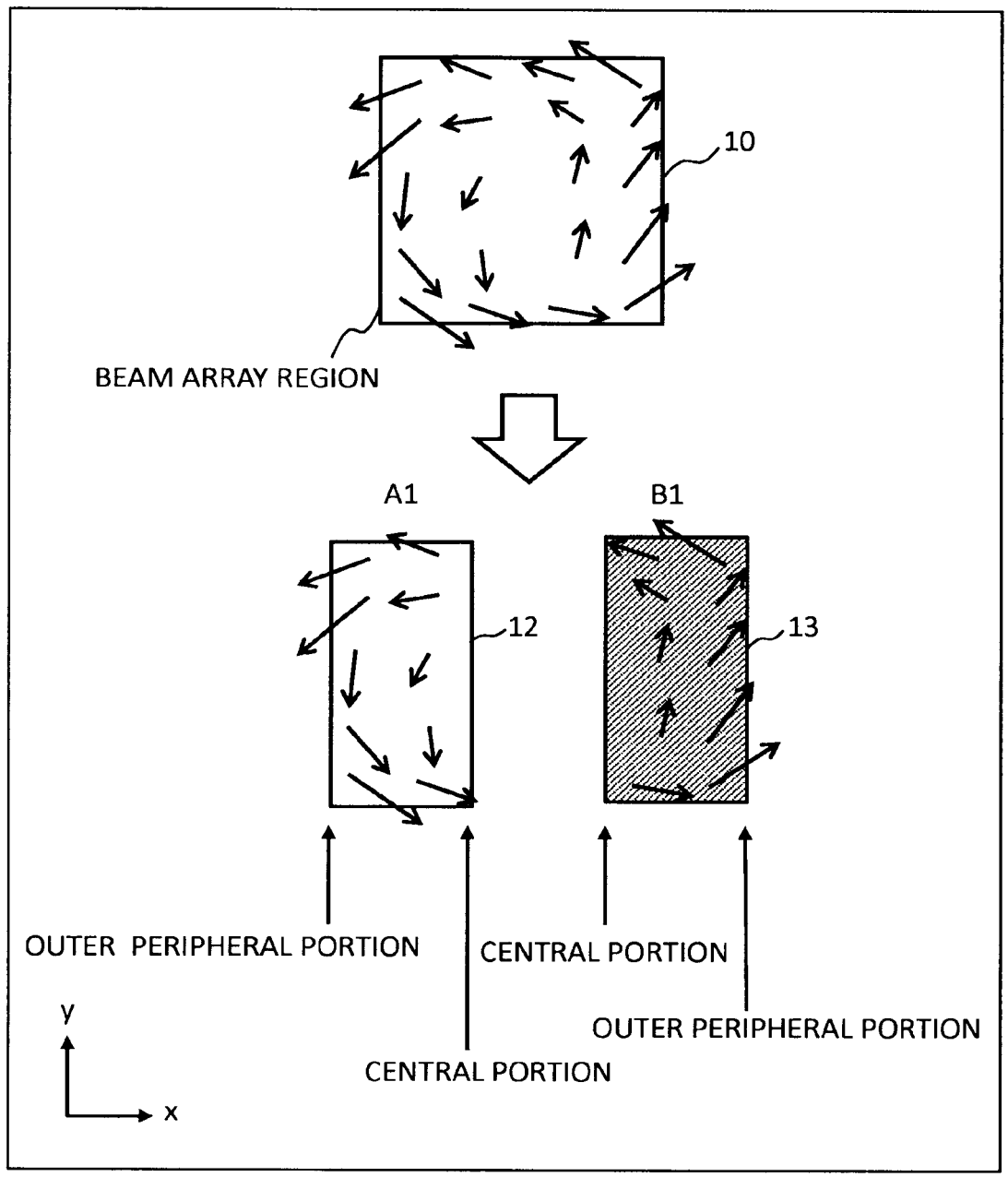
FIG. 10 is an illustration showing an example of a block region according to the first embodiment.

FIG. 10 is an illustration showing an example of a block region according to the first embodiment. FIG. 10 shows the case where the beam array region 10 is divided in the x direction into a plurality of block regions, such as into halves (dividing by a perpendicular or vertical line) of block regions 12 and 13. The block region 12 is configured by a region A1 being a left half of the beam array region 10. The block region 13 is configured by a region B1 being a right half of the beam array region 10. Therefore, when each sub-irradiation region 29 is written with beams whose configuration is the same as that applied to the beam array region 10, the position deviation of the left outer peripheral portion of the beam array region 10 occurs at the left outer peripheral portion of the block region 12 of the region A1. The position deviation of the central portion of the beam array region 10 occurs at the right outer peripheral portion of the block region 12 of the region A1. By contrast, the position deviation of the central portion of the beam array region 10 occurs at the left outer peripheral portion of the block region 13 of the region B1. The position deviation of the right outer peripheral portion of the beam array region 10 occurs at the right outer peripheral portion of the block region 13 of the region B1.

The case of dividing the beam array region 10 into halves is shown in the example of FIG. 10, but it is not limited thereto. The number of a plurality of block regions to be formed is determined using the multiplicity of a preset multiple writing which is performed without shifting the position of the stripe region 32 (writing region). FIG. 10 shows the case of multiple writing with the multiplicity N=2 performed without shifting the position of the stripe region 32. For example, in the case of the multiplicity N=4, the beam array region 10 is divided in the x direction into quarters, and multiple writing with the multiplicity N=4 is performed without shifting the position of the stripe region 32.

In the position deviation amount measuring step (S104), the writing apparatus 100 writes, on an evaluation substrate, an evaluation pattern for the beam array region 10 with the multiple beams 20 according to a preset writing sequence. Then, using the written evaluation substrate, a pattern position deviation amount at each position in the beam array region 10 is measured by a position measuring instrument. Measured data on the position deviation amount is input into the writing apparatus 100 from the outside, and stored in the storage device 144. Then, a position deviation evaluation region is set for 8×8 sub-irradiation regions 29 adjacent to each other, for example. Since it is possible to represent the 8×8 sub-irradiation regions 29 adjacent to each other as one position deviation evaluation region, the beam array region 10 composed of the 32×32 sub-irradiation regions 29 can be divided into 16 (4×4) position deviation evaluation regions. Then, the position deviation map generation unit 54 reads position deviation amounts stored in the storage device 144, calculates an average of the position deviation amounts of evaluation patterns in each position deviation evaluation region, and generates a position deviation map. Thereby, the position deviation amount at each position in the beam array region 10 shown in FIG. 8A can be acquired. The position deviation map is stored in the storage device 144, in relation to the block region. Although the case of defining one position deviation amount for each of 4×4 position deviation evaluation regions is here described, it is not limited thereto. It is also preferable to define the position deviation amount for each position having been further subdivided.

In the modulation rate calculation step (S108), the modulation rate calculation unit 59 (correction amount calculation unit) calculates, for each of the plurality of block regions 12 and 13, a modulation rate (factor) of a dose (irradiation amount) being a correction amount for each beam to correct a position deviation of a pattern written with a plurality of beams to be applied to the block region concerned, in the case of writing the stripe region 32 of the target object 101 in a manner of covering it without overlapping by applying irradiation to the block region concerned, or, in other words, in the case of writing the stripe region 32 of the target object 101 in a manner of covering it by connecting the same block regions.

Figure 11A:
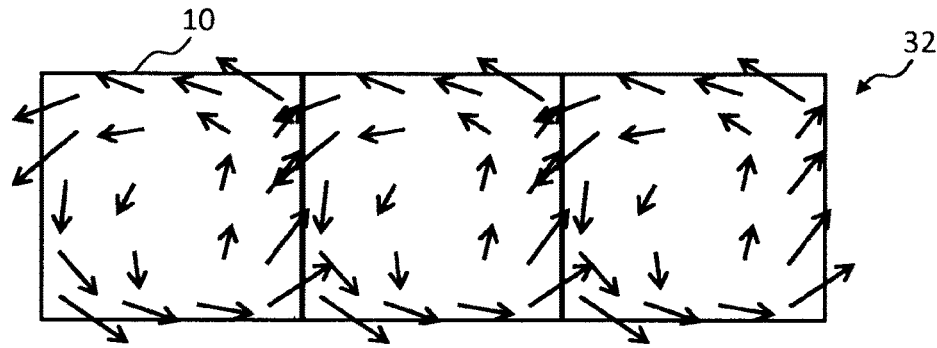
FIGS. 11A and 11B are illustrations for explaining each writing processing of multiple writing according to the first embodiment.
Figure 11B:
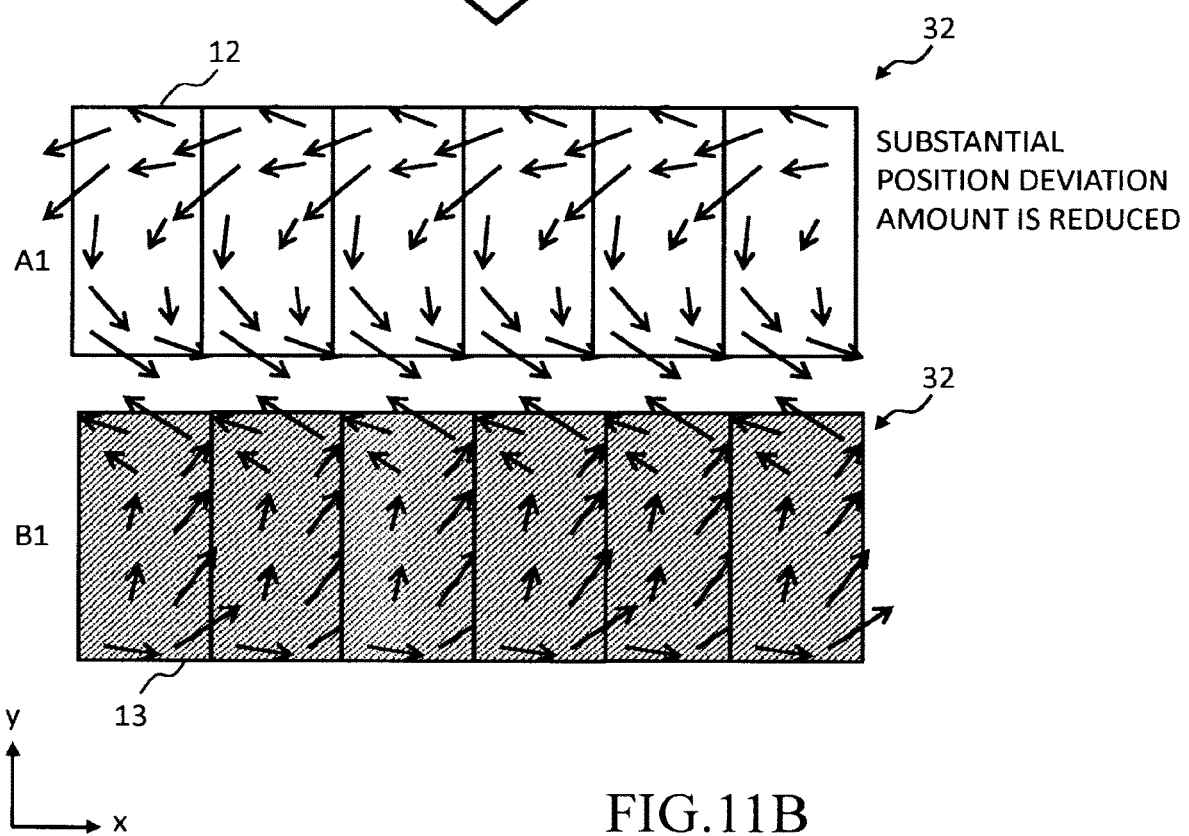

FIGS. 11A and 11B are illustrations for explaining each writing processing of multiple writing according to the first embodiment. In the first embodiment, multiple writing is performed in a manner of covering the stripe region 32 (writing region) of the target object 101 by connecting the same one of each of the block regions 12 and 13 as shown in FIG. 11B, which is not the writing processing of a comparative example shown in FIG. 11A of simply repeating the writing of the beam array region 10. In other words, the multiple writing of the first embodiment is performed by the writing processing to cover the stripe region 32 by repeating the block region 13 of the region B1, and the writing processing to cover the stripe region 32 by repeating the block region 12 of the region A1. Accordingly, irradiation time data for one pass of the multiple writing is generated for the writing processing of repeating the block region 13 of the region B1 to cover the stripe region 32, and another irradiation time data for one pass of the multiple writing is generated for the writing processing of repeating the block region 12 of the region A1 to cover the stripe region 32. Thus, in the first pass, since the block regions 13 of the region B1 are connected, the right outer peripheral portion and the left outer peripheral portion of the region B1 are connected at the border between the block regions 13. In the second pass, since the block regions 12 of the region A1 are connected, the right outer peripheral portion and the left outer peripheral portion of the region A1 are connected at the border between the block regions 12. Therefore, in both the cases, since the outer peripheral portion and the central portion of the beam array regions 10 are connected at the border, it seems, seemingly, that the border where the right and left end portions of the beam array regions 10 are connected to each other does not exist. Thus, the substantial position deviation amount at the border position for each pass can be reduced. The maximum position deviation amount of a pattern easily occurs at such a border position. Therefore, when the writing processing is divided for each block region, the maximum position deviation amount which occurs at the border position can be reduced in many cases. Then, on writing data, since data processing is performed for each pass, the modulation rate calculation unit 59 calculates a modulation rate of the dose of each beam per pass, based on the reduced position deviation amount. If the writing sequence is determined, it is determined, for each block region, which beam irradiates each pixel 36 in the block region. Further, the position deviation amount at each position in the block region can be referred to from the position deviation map stored in the storage device 144. Then, the dose modulation rate of a beam which irradiates each target pixel 36 in the block region is calculated. The method of obtaining a modulation rate for correcting a position deviation may be the same as the conventional method. For example, for each of peripheral pixels where a portion of a beam is overlapped because the beam has deviated from the target pixel to be irradiated, the ratio obtained by dividing the deviated area (area of beam overlapping portion) by the beam area is calculated as a distribution amount (beam modulation rate) to be distributed to a pixel located opposite to the pixel where the beam is overlapped.

The pass of multiple writing according to the first embodiment does not indicate the case where the stage moves, totally twice, to perform writing from the first position to the last position of the stripe region 32, which is regarded as the first pass, and, after the first writing, the stage is returned to the first position to start writing the stripe region 32 again to the last position, which is regarded as the second pass. According to the first embodiment, during a stage movement, multiple writing is performed by the first pass writing processing to write each pass for the first time, and by the second pass writing processing to write each pass for the second time.

In the rasterization step (S110), the rasterization unit 50 reads writing data from the storage device 140, and calculates, for each pixel 36, a pattern area density $\rho'$ in the pixel 36 concerned. This processing is performed for each stripe region 32, for example.

In the dose calculation step (S116), the dose map generation unit 52, first, virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 µm. The dose map generation unit 52 reads writing data from the storage device 140, and calculates, for each proximity mesh region, a pattern area density $\rho$ of a pattern arranged in the proximity mesh region concerned.

Next, the dose map generation unit 52 calculates, for each proximity mesh region, a proximity effect correction irradiation coefficient $D_p(x)$ (correction dose) for correcting a proximity effect. An unknown proximity effect correction irradiation coefficient $D_p(x)$ can be defined by a threshold model, which is similar to a conventional method, for correcting a proximity effect, by using a backscatter coefficient $\eta$, a dose threshold $D_{th}$ of a threshold model, a pattern area density $\rho$, and a distribution function $g(x)$.

Next, the dose map generation unit 52 calculates, for each pixel 36, an incident dose $D(x)$ (amount of dose) with which the pixel 36 concerned is irradiated. The incident dose $D(x)$ can be calculated, for example, by multiplying a preset base dose $D_{base}$ by a proximity effect correction irradiation coefficient $D_p$ and a pattern area density $\rho'$. The base dose $D_{base}$ can be defined by $D_{th}/(1/2+\eta)$, for example. Thereby, it is possible to obtain an originally desired incident dose $D(x)$, for which the proximity effect has been corrected, based on layout of a plurality of figure patterns defined by the writing data.

The dose map generation unit 52 generates a dose map defining the incident dose $D(x)$ for each pixel 36 per stripe. Such incident dose $D(x)$ for each pixel 36 serves as a designed incident dose $D(x)$ with which the control grid 27 of the pixel 36 concerned is to be irradiated. In other words, the dose map generation unit 52 generates a dose map defining an incident dose $D(x)$ for each control grid 27 per stripe. The generated dose map is stored in the storage device 142, for example.

In the dose calculation step (S120) for each block pass, the dose map generation unit 58 calculates a dose of each pixel, for each pass having been set for each block region, and generates a dose map. Specifically, the dose map generation unit 58 distributes, for each pass and for each pixel 36, a distribution dose amount to a peripheral pixel being a distribution destination, where the distribution dose amount is obtained by multiplying a dose amount, which is calculated by dividing a dose amount D of the pixel 36 concerned by a multiplicity, by a calculated dose modulation rate.

Thereby, it becomes possible to obtain a dose for which a pattern position deviation and/or a pattern shape deviation resulting from a position deviation of a beam irradiation position has been corrected. A dose map for each pass having been set for each block region is generated using a dose amount of each pixel 36 (control grid 27) after a position deviation of the irradiation position has been corrected. The dose of each beam is affected by a dose modulation rate for correcting a position deviation. At the border between the beam array regions 10, for example, since a position deviation of +Δ at one end of the beam array region 10 and a position deviation of −Δ at the other end are added, the position deviation amount increases in many cases. As a result, the dose increases in many cases. By contrast, at the border between the block regions 13, or between the block regions 12, since it is possible to reduce a position deviation at one end which is to be added, the dose can be reduced in many cases, compared with the border between the beam array regions 10.

In the irradiation time calculation step (S122), the irradiation time calculation unit 72 calculates an irradiation time t corresponding to the dose for each pixel of each pass, for which position deviation has been corrected. The irradiation time t can be obtained by dividing the dose D by a current density. The irradiation time t of each pixel 36 (control grid 27) is calculated as a value within the maximum irradiation time Ttr which is the maximum for irradiation by one shot of the multiple beams 20. Irradiation time data is stored in the storage device 142.

In the multiple writing step (S124), first, the writing control unit 74 rearranges irradiation time data, in order of shot, based on the writing sequence. Then, the irradiation time data is transmitted in order of shot to the deflection control circuit 130. In the first embodiment, the first pass and the second pass are executed in parallel simultaneously. Therefore, while the irradiation time data for the first pass is transmitted, in order of shot, for the beam associated with the block region 13, the irradiation time data for the second pass is also transmitted, in order of shot, for the beam associated with the block region 12. The deflection control circuit 130 outputs a blanking control signal in order of shot to the blanking aperture array mechanism 204, and outputs a deflection control signal in order of shot to the DAC amplifiers 132 and 134. Using the multiple beams 20 corrected based on a modulation rate (a correction amount) for each of the block regions 12 and 13, the writing mechanism 150 performs multiple writing such that irradiation of each of the block regions 12 and 13 is at least performed by any one of writing processing of multiple writing, and such that each writing processing of the multiple writing is performed to write the writing region of the target object 101 in a manner of covering the writing region without overlapping by, using one of the plurality of block regions 12 and 13, irradiation of the one of the plurality of block regions 12 and 13. In other words, using the multiple beams 20 corrected based on a modulation rate (a correction amount) for each of the block regions 12 and 13, the writing mechanism 150 performs multiple writing such that the stripe region 32 of the target object 101 is covered by connecting the same block regions of the block regions 12 and 13 in a writing processing of each pass as shown in FIG. 11B.

In the writing sequence shown in FIG. 6, while the XY stage 105 moves the distance of 32 beam pitches, all the pixels in the beam array region 10 are written with the multiple beams 20. By contrast, according to the first embodiment, while the XY stage 105 moves the distance of 32 beam pitches, each of the block regions 12 and 13 needs to be written twice. Therefore, in the first embodiment, it is necessary to control to complete once writing of each of the block regions 12 and 13 with the multiple beams 20 while the XY stage 105 moves the distance of 16 beam pitches. Thus, it shortens the shot cycle time by ½. Alternatively, instead of changing the shot cycle time, the same processing can be executed by reducing the stage speed to ½ and performing one tracking control while the XY stage 105 moves the distance of 8 beam pitches.

According to the first embodiment, the maximum position deviation amount of a pattern can be reduced. Therefore, the maximum modulation amount of a dose can be reduced. Accordingly, the writing time can be reduced. Thus, the shot cycle can be shortened than that of the case of multiple writing of the multiplicity N=2 according to the writing sequence shown in FIG. 6. As a result, the writing time can be reduced.

Second Embodiment

Although, in the first embodiment, the configuration where the beam array region 10 is divided in the x direction into a plurality of block regions, such as into halves (dividing by a perpendicular or vertical line) is described, it is not limited thereto. In a second embodiment, a configuration will be described where the beam array region 10 is divided in the y direction into a plurality of block regions, such as into halves (dividing by a lateral or horizontal line). The configuration of the writing apparatus 100 in the second embodiment may be the same as that of FIG. 1. Further, in the second embodiment, a flowchart showing main steps of a writing method is the same as that of FIG. 9. The contents of the second embodiment are the same as those of the first embodiment except for what is particularly described below.

Figure 12:
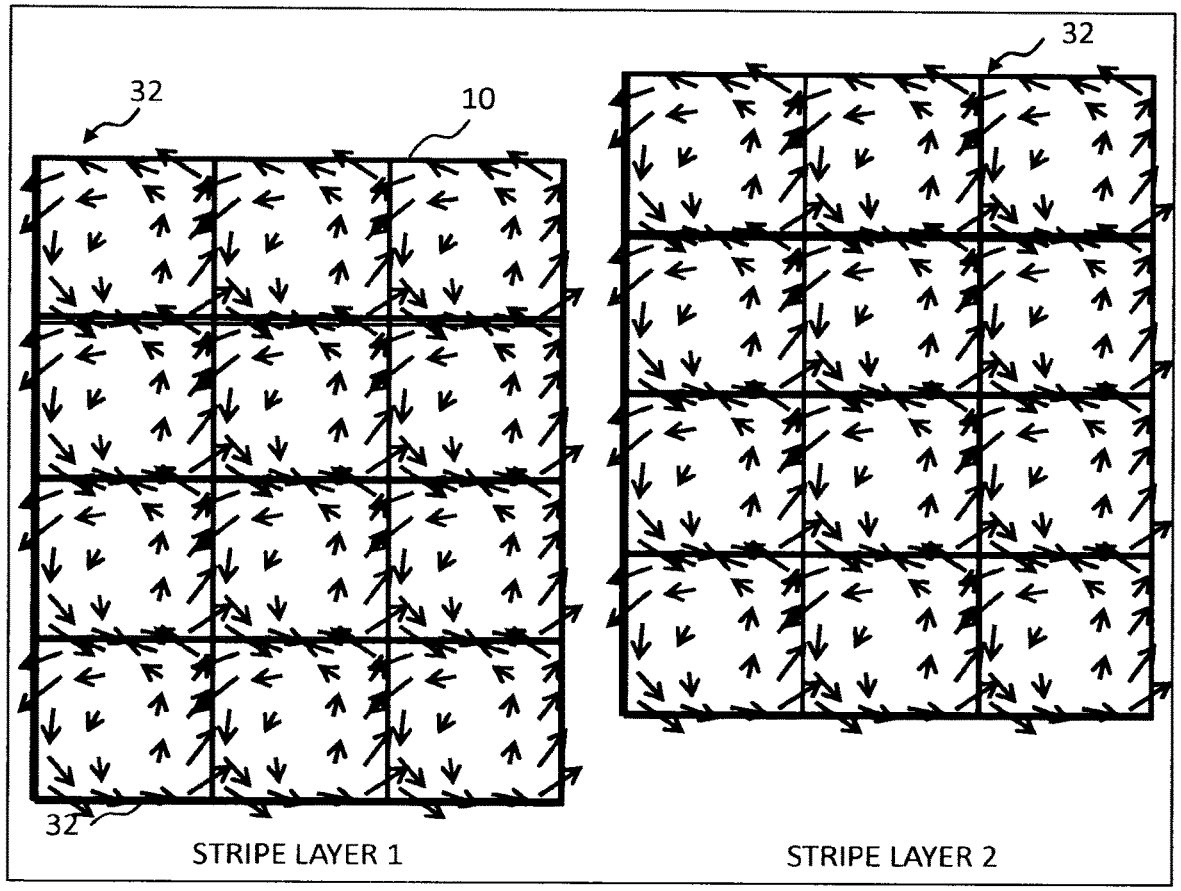
FIG. 12 is an illustration for explaining a state of position deviation according to a comparative example of a second embodiment.

FIG. 12 is an illustration for explaining a state of position deviation according to a comparative example of the second embodiment. In the multiple writing of the comparative example performed while shifting the position of the stripe region 32, as shown in FIG. 12, on the stripe layer of the first pass, the border between the stripe regions is repeated in a manner such that the beam array regions 10 contact with each other. Similarly, on the stripe layer of the second pass, the border between the stripe regions is repeated in a manner such that the beam array regions 10 contact with each other. In both the cases, the upper and lower end portions of the beam array regions 10 are connected to each other. As described above, the maximum position deviation amount of a pattern easily occurs at such a border position. Therefore, the position deviation amount increases at the border of the stripe regions 32. As described above, the position deviation amount of the beam array region 10 is different according to the contents of the writing sequence, and it has a tendency of easily increasing at the outer peripheral portion. For example, in the writing sequence shown in FIG. 6, since the arrangement positions of the beams are irregularly separated from each other in the x direction, the position deviation amount can be averaged. However, since the beam positions are the same in the y direction, they are not averaged in the y direction. For this reason, the amount of position deviation particularly increases at the border between the beam array regions 10 shown in FIG. 12. The more the position deviation amount of a pattern increases, the more the maximum modulation amount of the dose becomes. Then, block regions divided in the y direction are formed in the second embodiment.

In the block region forming step (S102), the block region forming unit 56 forms a plurality of block regions by dividing, in the y direction, the beam array region 10 (rectangular region).

Figure 13:
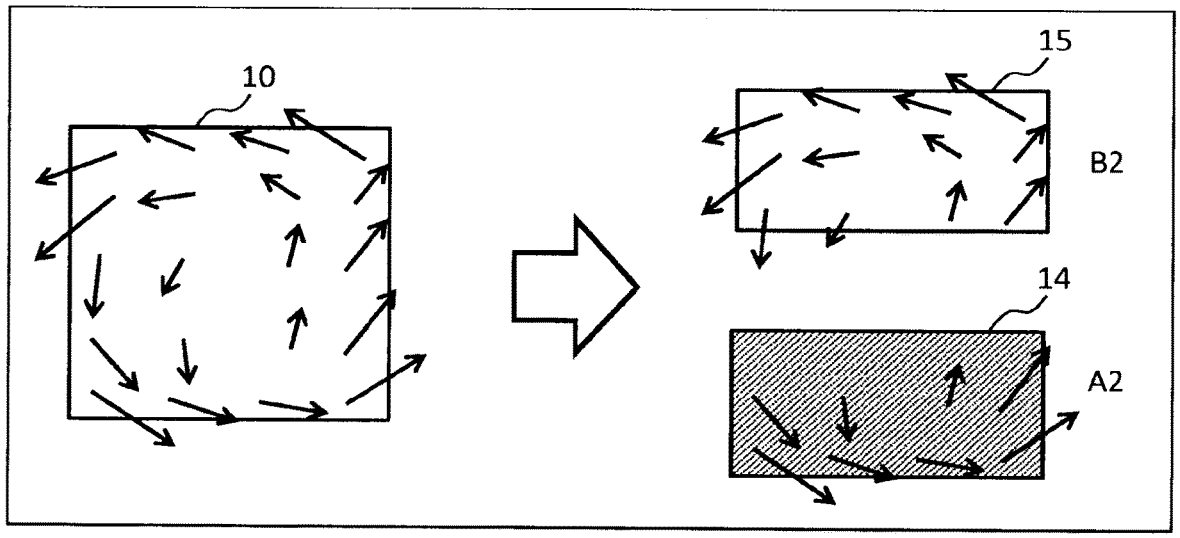
FIG. 13 is an illustration showing an example of a block region according to the second embodiment.

FIG. 13 is an illustration showing an example of a block region according to the second embodiment. FIG. 13 shows the case where the beam array region 10 is divided in the y direction into a plurality of block regions, such as into halves (dividing by a lateral or horizontal line) of block regions 14 and 15. The block region 14 is configured by a region A2 being a lower half of the beam array region 10. The block region 15 is configured by a region B2 being an upper half of the beam array region 10. Therefore, when each sub-irradiation region 29 is written with beams whose configuration is the same as that applied to the beam array region 10, the position deviation of the lower outer peripheral portion of the beam array region 10 occurs at the lower outer peripheral portion of the block region 14 of the region A2. The position deviation of the central portion of the beam array region 10 occurs at the upper outer peripheral portion of the block region 14 of the region A2. By contrast, the position deviation of the central portion of the beam array region 10 occurs at the lower outer peripheral portion of the block region 15 of the region B2. The position deviation of the upper outer peripheral portion of the beam array region 10 occurs at the upper outer peripheral portion of the block region 15 of the region B2.

The case of dividing the beam array region 10 into halves is shown in the example of FIG. 13, but it is not limited thereto. The number of a plurality of block regions to be formed is determined using the multiplicity of a preset multiple writing performed while shifting the position of the stripe region 32 (writing region). FIG. 13 shows the case of multiple writing with the multiplicity N=2 performed while shifting the position of the stripe region 32 by ½ of the short-side width of the stripe region 32. For example, in the case of the multiplicity N=4, the beam array region 10 is divided in the y direction into quarters, and multiple writing is performed while shifting the position of the stripe region 32 by ¼ of the short-side width of the stripe region 32.

In the modulation rate calculation step (S108), the modulation rate calculation unit 59 (correction amount calculation unit) calculates, for each of the plurality of block regions 14 and 15, a modulation rate (factor) of a dose (irradiation amount) being a correction amount for each beam to correct a position deviation of a pattern written with a plurality of beams to be applied to the block region concerned, in the case of writing the stripe region 32 of the target object 101 in a manner of covering it by connecting the same block regions.

Figure 14:
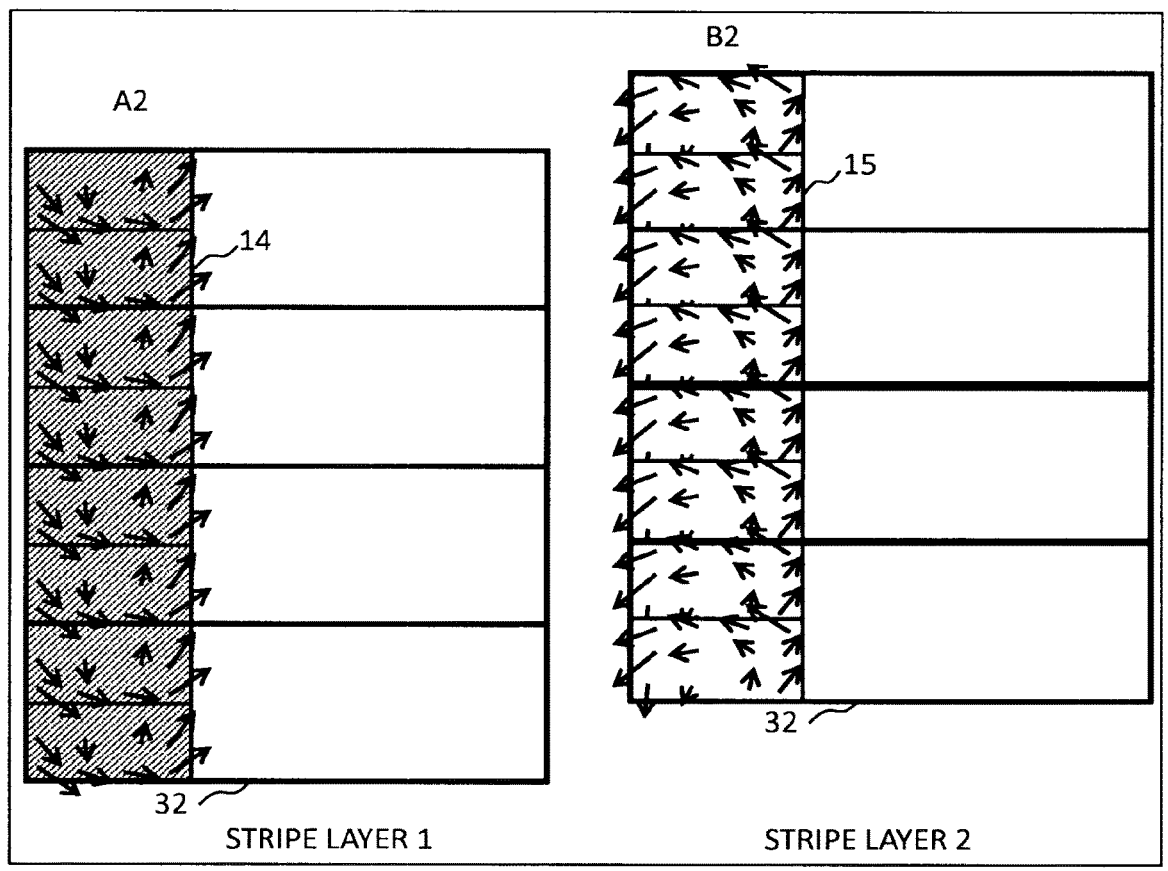
FIG. 14 is an illustration for explaining each writing processing of multiple writing according to the second embodiment.

FIG. 14 is an illustration for explaining each writing processing of multiple writing according to the second embodiment. As shown in FIG. 14, multiple writing is performed in a manner of covering the stripe region 32 (writing region) of the target object 101 by connecting the same one of each of the block regions 14 and 15. In other words, in the writing processing of the stripe layer 1, the stripe region 32 is covered by repeating the block region 14 of the region A2 lengthwise. In the writing processing of the stripe layer 2, the stripe region 32 is covered by repeating the block region 15 of the region B2 lengthwise. According to the second embodiment, the stripe layer 1 is configured by connecting the block regions 14 of the region A2 upward in manner of covering the stripe regions 32 without gaps. The stripe layer 2 is configured by connecting the block regions 15 of the region B2 upward in manner of covering the stripe regions 32 without gaps. Multiple writing is performed by the writing processing of the stripe layer 1, and the writing processing of the stripe layer 2 obtained by shifting, in the y direction, the position by ½ of the width of the stripe region.

Irradiation time data for one pass of the multiple writing is generated for the writing processing of repeating the block region 14 of the region A2 to cover the stripe region 32, and another irradiation time data for one pass of the multiple writing is generated for the writing processing of repeating the block region 15 of the region B2 to cover the stripe region 32. Therefore, in the first pass, since the block regions 14 of the region A2 are connected in the y direction, the upper outer peripheral portion and the lower outer peripheral portion of the region A2 are connected at the border between the stripe regions 32. In the second pass, since the block regions 15 of the region B2 are connected in the y direction, the upper outer peripheral portion and the lower outer peripheral portion of the region B2 are connected at the border between the stripe regions 32.

Therefore, in both the cases, since the outer peripheral portion and the central portion of the beam array regions 10 are connected at the border, it seems, seemingly, that the border where the upper and lower end portions of the beam array regions 10 are connected to each other does not exist. Thus, the substantial position deviation amount at the border position for each pass can be reduced. The maximum position deviation amount of a pattern easily occurs at such a border position. Therefore, when the writing processing is divided for each block region, the maximum position deviation amount which occurs at the stripe border position can be reduced in many cases. Then, on writing data, since data processing is performed for each pass, the modulation rate calculation unit 59 calculates a modulation rate of the dose of each beam per pass, based on the reduced position deviation amount. If the writing sequence is determined, it is determined, for each block region, which beam irradiates each pixel 36 in the block region. Further, the position deviation amount at each position in the block region can be referred to from the position deviation map stored in the storage device 144.

The contents of each of the rasterization step (S110), the dose calculation step (S116), and the dose calculation step (S120) for each block pass are the same as those of the first embodiment.

In the multiple writing step (S124), using the multiple beams 20 which have been corrected based on a modulation rate (a correction amount) for each of the block regions 14 and 15, the writing mechanism 150 performs multiple writing in a manner of covering the stripe region 32 of the target object 101 by connecting the same one of each of the block regions 14 and 15 as shown in FIG. 14.

Figure 15:
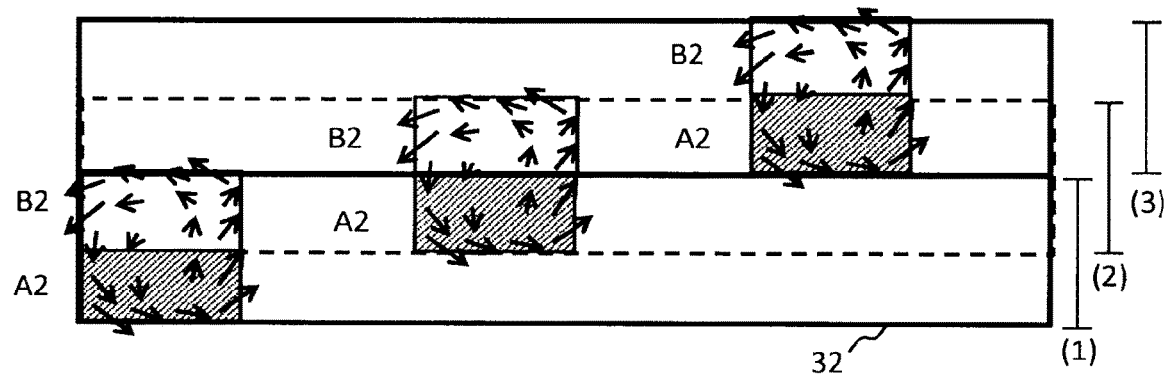
FIG. 15 is an illustration for explaining multiple writing performed while shifting a position according to the second embodiment.

FIG. 15 is an illustration for explaining multiple writing performed while shifting the position according to the second embodiment. As shown in FIG. 15, the lower half of the k-th stripe region 32 of the stripe layer 1 (S1) and the lower half of the k-th stripe region 32 of the stripe layer 2 (S2) are written simultaneously. Then, the writing target region with the multiple beams 20 is moved in the y direction by ½ of the stripe width. Next, the upper half of the k-th stripe region 32 of the stripe layer 1, and the upper half of the k-th stripe region 32 of the stripe layer 2 are written simultaneously. Then, the writing target region with the multiple beams 20 is moved in the y direction by ½ of the stripe width. Next, the lower half of the (k+1)th stripe region 32 of the stripe layer 1, and the lower half of the (k+1)th stripe region 32 of the stripe layer 2 are written simultaneously. Henceforth, by similarly proceeding the writing processing, multiple writing is performed for each stripe region 32 with the beams applied to each of the block regions 14 and 15. Thus, in the multiple writing according to the second embodiment, while the stage moves once, the writing processing for the first pass of the region A2 being a lower half of the beam array region 10, and the writing processing for the second pass of the region B2 being an upper half of the beam array region 10 are executed in parallel simultaneously.

Although the stage moving operation is not different from that of the multiple writing performed while shifting the position by ½ of the stripe width by using the beam array region 10, since, in the second embodiment, the processing on writing data is different, the maximum position deviation amount of a pattern can be reduced. Therefore, the maximum modulation amount of a dose can be reduced. Accordingly, the writing time can be reduced.

Third Embodiment

In a third embodiment, a configuration will be described where a configuration of dividing (by a perpendicular or vertical line), in the x direction, the beam array region 10, and a configuration of dividing (by a lateral or horizontal line), in the y direction, the beam array region 10 are combined. The configuration of the writing apparatus 100 in the third embodiment may be the same as that of FIG. 1. Further, in the third embodiment, a flowchart showing main steps of a writing method is the same as that of FIG. 9. The contents of the third embodiment are the same as those of the first or second embodiment except for what is particularly described below.

In the block region forming step (S102), the block region forming unit 56 forms a plurality of block regions by dividing, in the x and y directions, the beam array region 10 (rectangular region).

Figure 16:
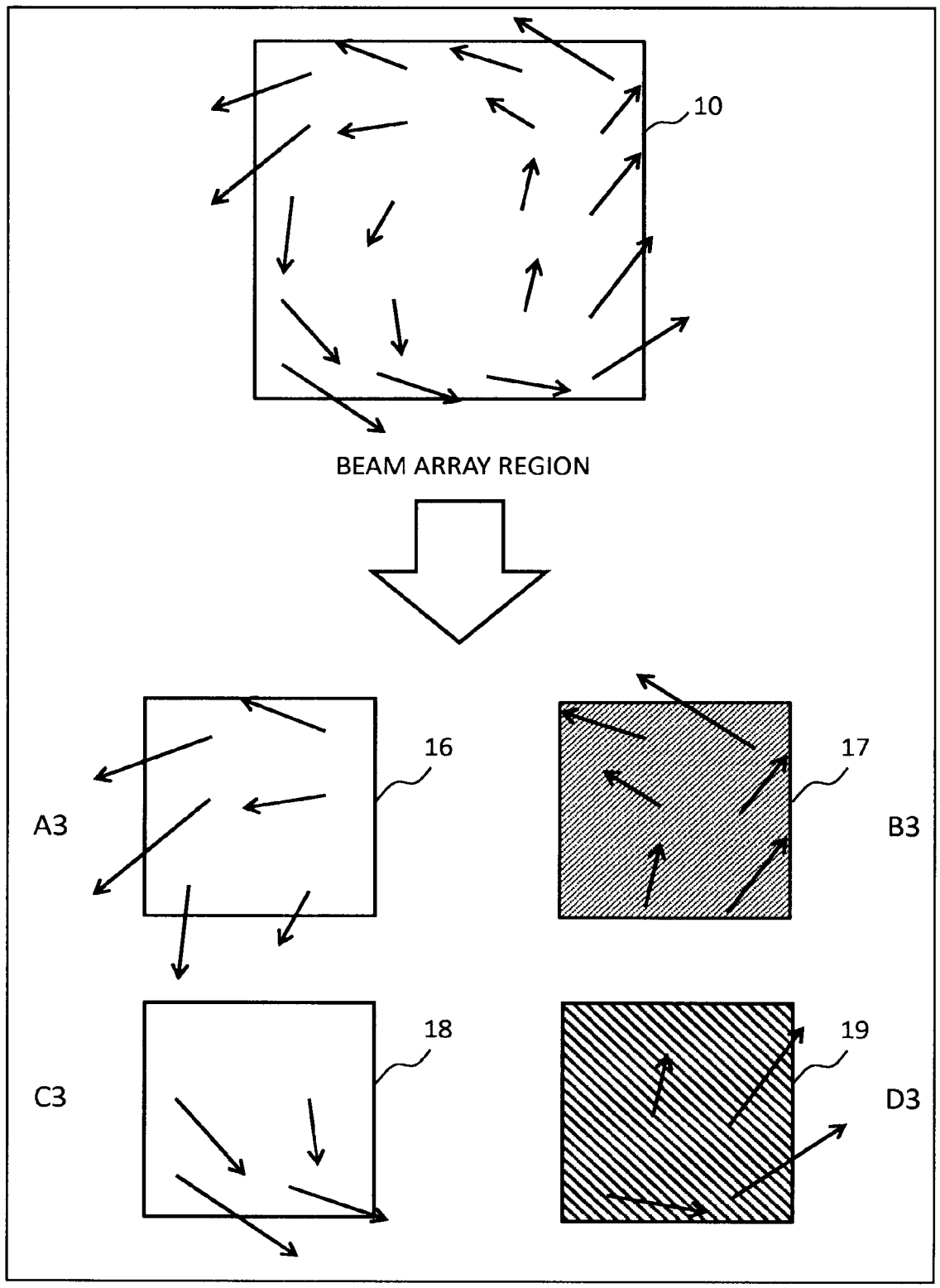
FIG. 16 is an illustration showing an example of a block region according to a third embodiment.

FIG. 16 is an illustration showing an example of a block region according to the third embodiment. FIG. 16 shows the case where the beam array region 10 is divided in the x direction into a plurality of block regions, such as into halves (dividing by a perpendicular or vertical line), and is divided in the y direction into a plurality of block regions, such as into halves (dividing by a lateral or horizontal line) so as to generate block regions 16, 17, 18 and 19. The block region 16 is configured by a region A3 being an upper left quarter of the beam array region 10. The block region 17 is configured by a region B3 being an upper right quarter of the beam array region 10. The block region 18 is configured by a region C3 being a lower left quarter of the beam array region 10. The block region 19 is configured by a region D3 being a lower right quarter of the beam array region 10.

The example of FIG. 16 shows the case of dividing in the x direction the beam array region 10 into halves, and dividing in the y direction it into halves, that is totally into quarters. However, it is not limited thereto. The number of a plurality of block regions to be formed is determined using a total of the multiplicity of a preset multiple writing performed without shifting the position of the stripe region 32 (writing region) and the multiplicity of a preset multiple writing performed while shifting the position of the stripe region 32 (writing region). FIG. 16 shows the case of multiple writing with the multiplicity N=4 combining the multiple writing with the multiplicity N=2 performed without shifting the position of the stripe region 32, and the multiple writing with the multiplicity N=2 performed while shifting the position of the stripe region 32 by ½ of the short-side width of the stripe region 32.

In the modulation rate calculation step (S108), the modulation rate calculation unit 59 (correction amount calculation unit) calculates, for each of the plurality of block regions 16, 17, 18 and 19, a modulation rate (factor) of a dose (irradiation amount) being a correction amount for each beam to correct a position deviation of a pattern written with a plurality of beams to be applied to the block region concerned, in the case of writing the stripe region 32 of the target object 101 in a manner of covering it by connecting the same block regions.

Figure 17:
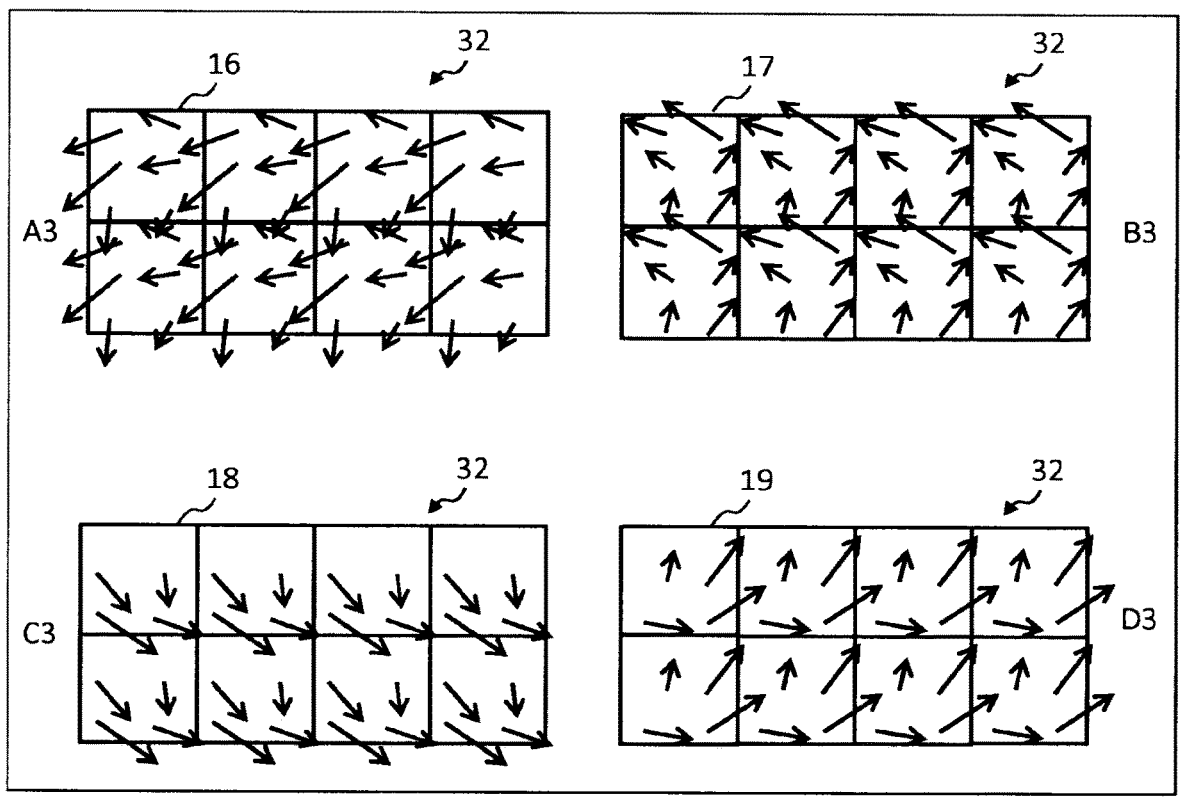
FIG. 17 is an illustration for explaining each writing processing of multiple writing according to the third embodiment.

FIG. 17 is an illustration for explaining each writing processing of multiple writing according to the third embodiment. As shown in FIG. 17, multiple writing is performed in a manner of covering the stripe region 32 (writing region) of the target object 101 by connecting the same one of the block regions 16, 17, 18 and 19. In other words, in the writing processing of the stripe layer 1, the stripe region 32 is covered by lengthwise and widthwise repeating the block region 16 of the region A3. In the writing processing of the stripe layer 2, the stripe region 32 is covered by lengthwise and widthwise repeating the block region 17 of the region B3. In the writing processing of the stripe layer 3, the stripe region 32 is covered by lengthwise and widthwise repeating the block region 18 of the region C3. In the writing processing of the stripe layer 4, the stripe region 32 is covered by lengthwise and widthwise repeating the block region 19 of the region D3. Multiple writing is performed by the writing processing of the stripe layer 1, the writing processing of the stripe layer 2, the writing processing of the stripe layer 3, and the writing processing of the stripe layer 4. Therefore, irradiation time data for one pass of the multiple writing is generated for the writing processing of repeating the block region 16 of the region A3 to cover the stripe region 32, another irradiation time data for one pass of the multiple writing is generated for the writing processing of repeating the block region 17 of the region B3 to cover the stripe region 32, another irradiation time data for one pass of the multiple writing is generated for the writing processing of repeating the block region 18 of the region C3 to cover the stripe region 32, and another irradiation time data for one pass of the multiple writing is generated for the writing processing of repeating the block region 19 of the region D3 to cover the stripe region 32. Therefore, in each pass, since the outer peripheral portion and the central portion of the beam array regions 10 are connected in the x and y directions at the border, it seems, seemingly, that the border where the outer peripheral ends of the beam array regions 10 are connected to each other does not exist. Therefore, when the writing processing is divided for each block region, the maximum position deviation amount which occurs at the border positions in the x and y directions can be reduced in many cases. Then, on writing data, since data processing is performed for each pass, the modulation rate calculation unit 59 calculates a modulation rate of the dose of each beam per pass, based on the reduced position deviation amount.

The contents of each of the rasterization step (S110), the dose calculation step (S116), and the dose calculation step (S120) for each block pass are the same as those of the first embodiment.

In the multiple writing step (S124), using the multiple beams 20 which have been corrected based on a modulation rate (a correction amount) for each of the block regions 16, 17, 18 and 19, the writing mechanism 150 performs multiple writing in a manner of covering the stripe region 32 of the target object 101 by connecting the same one of the block regions 16, 17, 18 and 19. As described in the first embodiment, it is necessary to control to complete writing of each of the block regions 16, 17, 18, and 19 with the multiple beams 20 while the XY stage 105 moves the distance of 16 beam pitches. Further, whenever writing of one stripe region 32 is completed, writing processing should be similarly performed while shifting a position of irradiation region of the multiple beams 20 in the y direction by ½ of the stripe width.

Fourth Embodiment

In the first to third embodiments, all the range of the beam array region 10 is divided, but it is not limited thereto. In a fourth embodiment, a configuration will be described where a block region which does not include a part of the beam array region 10 is formed. The configuration of the writing apparatus 100 according to the fourth embodiment may be the same as that of FIG. 1. Further, according to the fourth embodiment, a flowchart showing main steps of a writing method is the same as that of FIG. 9. The contents of the fourth embodiment are the same as those of the third embodiment except for what is particularly described below.

In the block region forming step (S102), the block region forming unit 56 forms a plurality of block regions so that a space may be formed between block regions. That is, specifically, a plurality of block regions to be divided in the x direction and/or the y direction are formed with a space formed in the x direction and/or the y direction from the beam array region 10 (rectangular region).

Figure 18A:
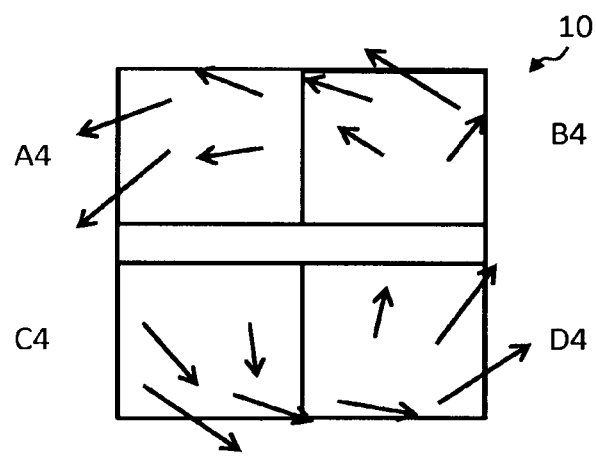
FIGS. 18A to 18C are illustrations showing examples of a block region according to a fourth embodiment.
Figure 18B:
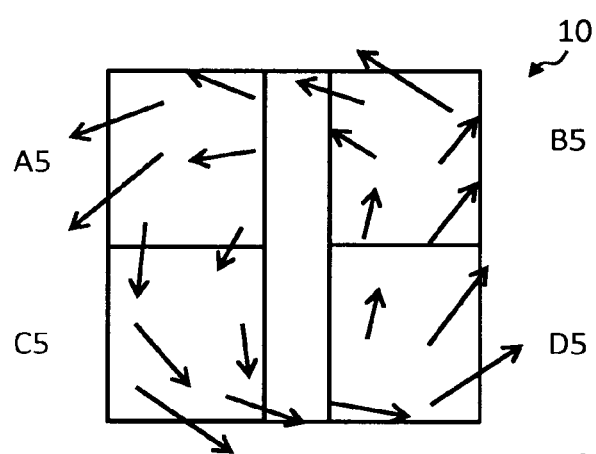
Figure 18C:
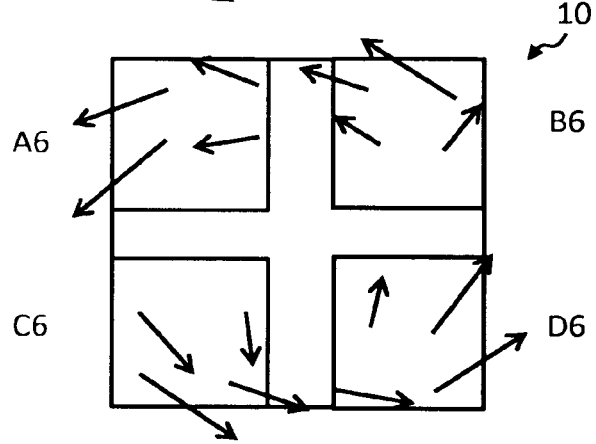

FIGS. 18A to 18C are illustrations showing examples of a block region according to the fourth embodiment. FIGS. 18A to 18C show the cases of generating four block regions from the beam array region 10. In the example of FIG. 18A, there is a space between the upper region (regions A4 and B4) and the lower region (regions C4 and D4). In the example of FIG. 18B, there is a space between the left side region (regions A5 and C5) and the right side region (regions B5 and D5). In the example of FIG. 18C, there are spaces between the upper left region A6, the upper right region B6, the lower left region C6, and the lower right region D6. It is preferable that a plurality of block regions are formed such that a space is formed, for example, at the position of a defective beam or a beam with a large position deviation in the multiple beams 20.

The contents of each subsequent step are the same as those of the third embodiment. However, when performing multiple writing, writing processing needs to be advanced in consideration of a space such that the region located at the space should not be remained without being written.

In order to correct a position deviation amount of a pattern due to a defective beam or a beam with a large position deviation, a large dose modulation amount is needed. By excluding a defective beam or a beam with a large position deviation from the beam array to be used, the maximum position deviation amount can be reduced. Therefore, the maximum modulation amount of a dose can be reduced. For excluding such a defective beam or a beam with a large position deviation, it is controlled to be beam OFF, for example. Alternatively, for example, if it is impossible to control to be beam OFF, a shutter may be arranged at the position corresponding to the above-described space in respective beam trajectories of the multiple beams, for example. Further, although the width size of the space is not subject to limitation, it is preferable to set it to be a value obtained by dividing the block region size which is in the direction to form a space by the number of passes, thereby making waste of the writing operation difficult to occur.

Fifth Embodiment

In the first to third embodiments, the configuration is described in which a main purpose is to reduce the maximum modulation amount by reducing a position deviation amount generated at the border where the beam array regions 10 are connected to each other. In a fifth embodiment, a configuration will be described in which a position deviation amount inside the beam array region 10 can also be reduced. What is not particularly described is the same as that of the third embodiment.

Figure 19:
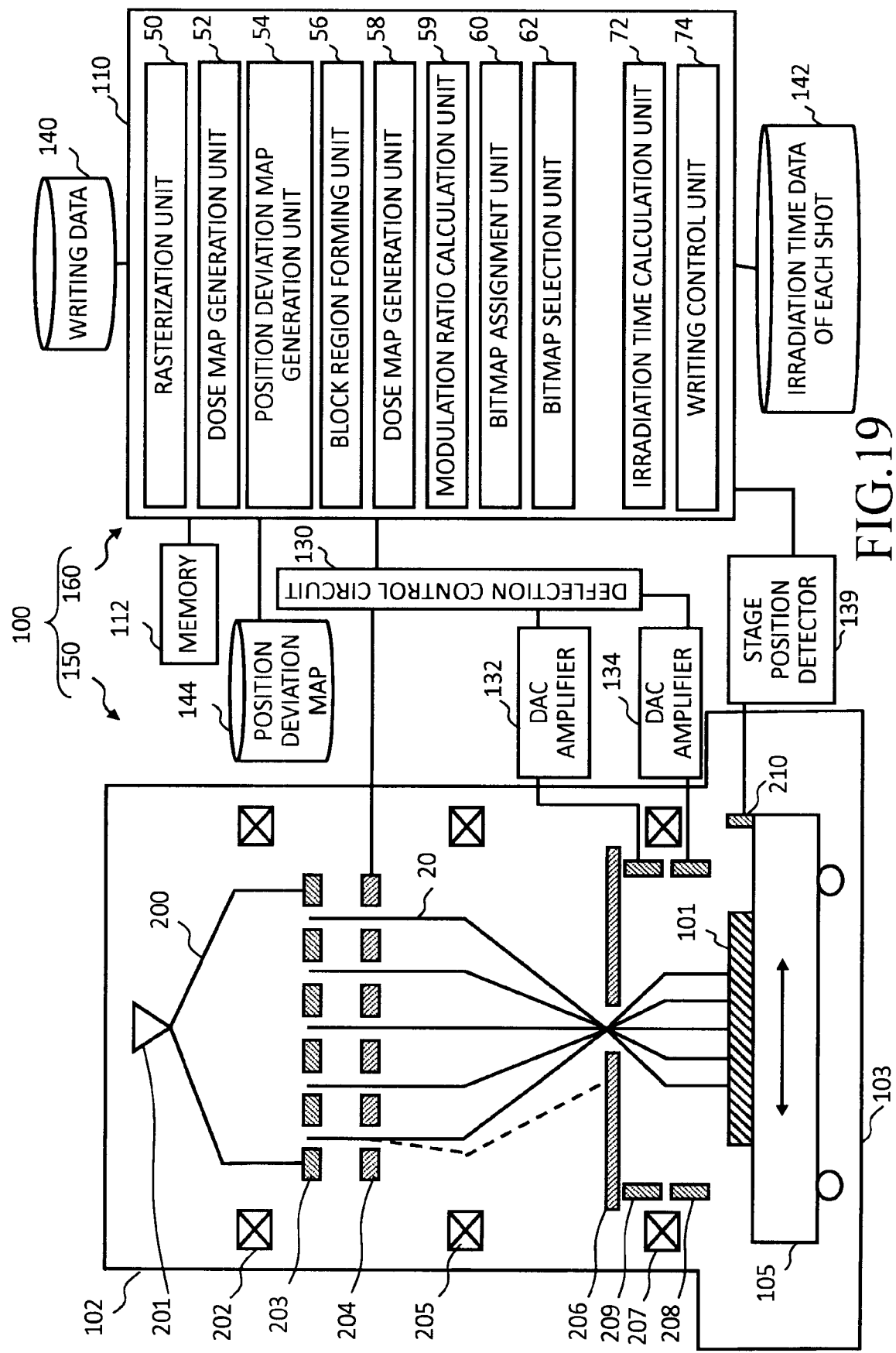
FIG. 19 is a conceptual diagram showing a configuration of a writing apparatus according to a fifth embodiment.

FIG. 19 is a conceptual diagram showing a configuration of a writing apparatus according to the fifth embodiment. FIG. 19 is the same as FIG. 1 except that a bitmap assignment unit 60 and a bitmap selection unit 62 are further added in the control computer 110.

Each of the " . . . units" such as the rasterization unit 50, the dose map generation unit 52, the position deviation map generation unit 54, the block region forming unit 56, the dose map generation unit 58, the modulation rate calculation unit 59, the bitmap assignment unit 60, the bitmap selection unit 62, the irradiation time calculation unit 72, and the writing control unit 74 includes processing circuitry. The processing circuitry includes, for example, an electric circuit, computer, processor, circuit board, quantum circuit, or semiconductor device. Each " . . . unit" may use common processing circuitry (the same processing circuitry), or different processing circuitry (separate processing circuitry). Information input/output to/from the rasterization unit 50, the dose map generation unit 52, the position deviation map generation unit 54, the block region forming unit 56, the dose map generation unit 58, the modulation rate calculation unit 59, the bitmap assignment unit 60, the bitmap selection unit 62, the irradiation time calculation unit 72, and the writing control unit 74, and information being operated are stored in the memory 112 each time.

Figure 20:
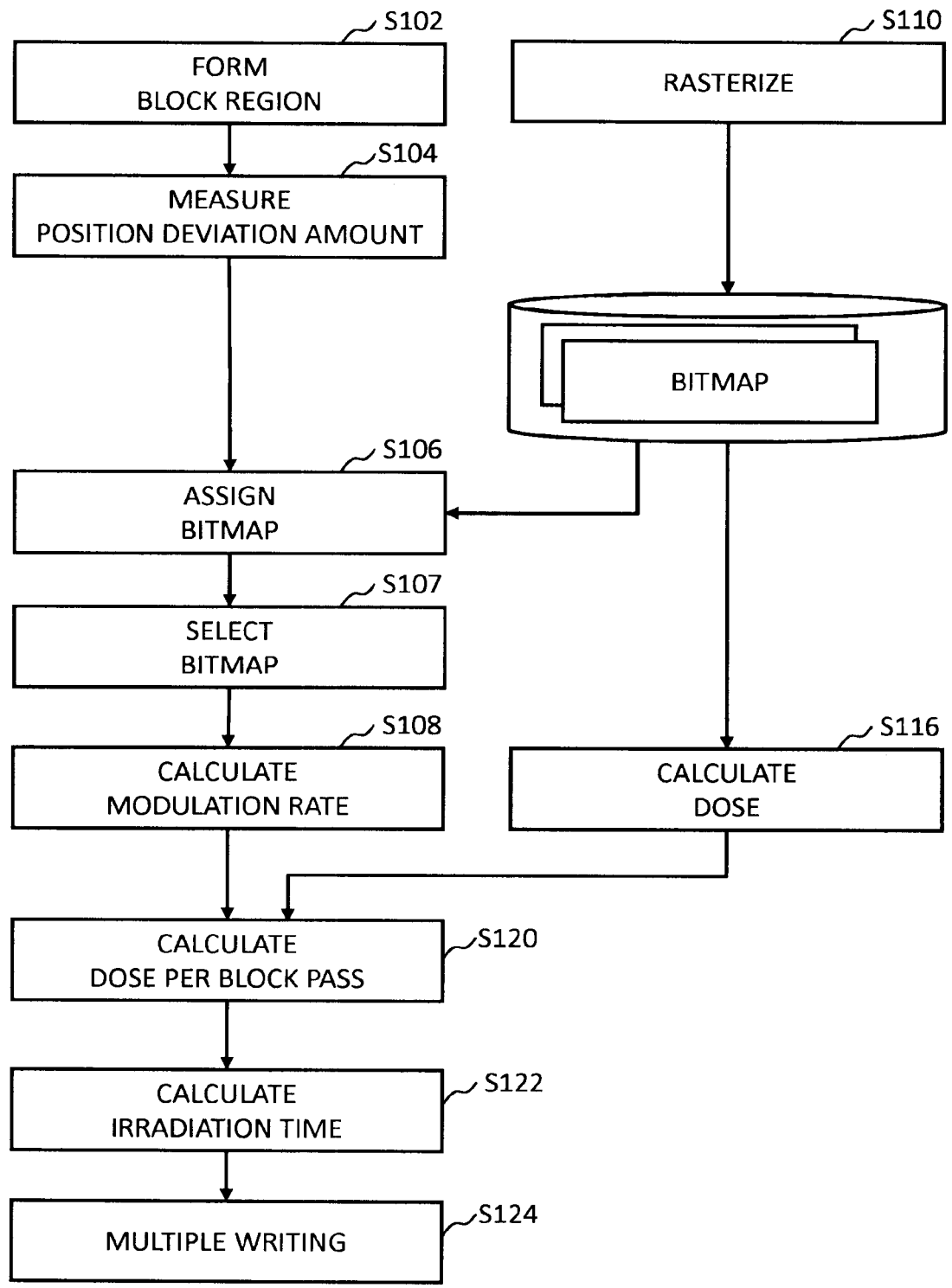
FIG. 20 is a flowchart showing main steps of a writing method according to the fifth embodiment.

FIG. 20 is a flowchart showing main steps of a writing method according to the fifth embodiment. FIG. 20 is the same as FIG. 9 except that a plurality of bitmaps each of which is shifted per sub pixel are generated in the rasterization step (S110), and that a bitmap assignment step (S106) and a bitmap selection step (S107) are added between the position deviation amount measuring step (S104) and the modulation rate calculation step (S108).

The contents of each of the block region forming step (S102) and the position deviation amount measuring step (S104) are the same as those of the third embodiment. In the block region forming step (S102), the four block regions 16, 17, 18, and 19 shown in FIG. 16 are formed, for example.

By the calculation processing in the rasterization step (S110), bitmap data of a reference mesh for each stripe region 32, in which a pattern area density ρ' of each pixel 36 is defined, is generated. In the case of executing multiple writing performed while shifting the position of the stripe region 32, bitmap data of a reference mesh is generated for each of the stripe layers 1 and 2 in the rasterization step (S110). In the case of executing multiple writing performed without shifting the position of the stripe region 32, since the stripe layer is not changed, it is sufficient that bitmap data of a reference mesh of one kind is generated in the rasterization step (S110). According to the fifth embodiment, similarly to the third embodiment, since both of the multiple writing performed without shifting the position of the stripe region 32 and the multiple writing performed while shifting the position of the stripe region 32 are performed, bitmap data of a reference mesh is generated for each of the stripe layers 1 and 2. The stripe layer 2, for example, is applied to the block regions 16 and 17 at the upper side of the beam array region 10. The stripe layer 1, for example, is applied to the block regions 18 and 19 at the lower side of the beam array region 10.

In addition to the bitmap data of a reference mesh described above, the rasterization unit 50 further generates at least one bitmap data in which a mesh position indicating a pixel of bitmap data of each reference mesh is shifted per sub pixel. If there are a plurality of stripe layers, it is preferable to generate at least one bitmap data in which shift processing is performed for each stripe layer. It is acceptable that the number of stripe layers is more than the number of bitmap data.

Figure 21B:
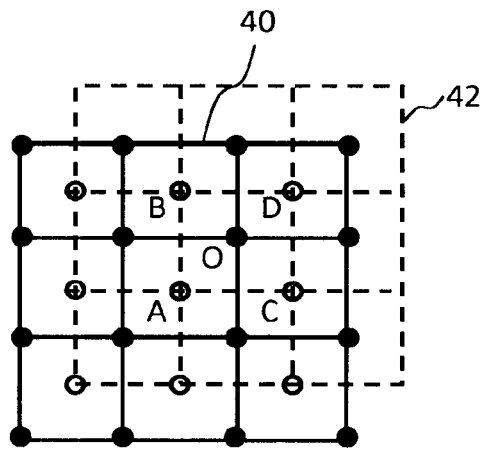
Figure 21C:
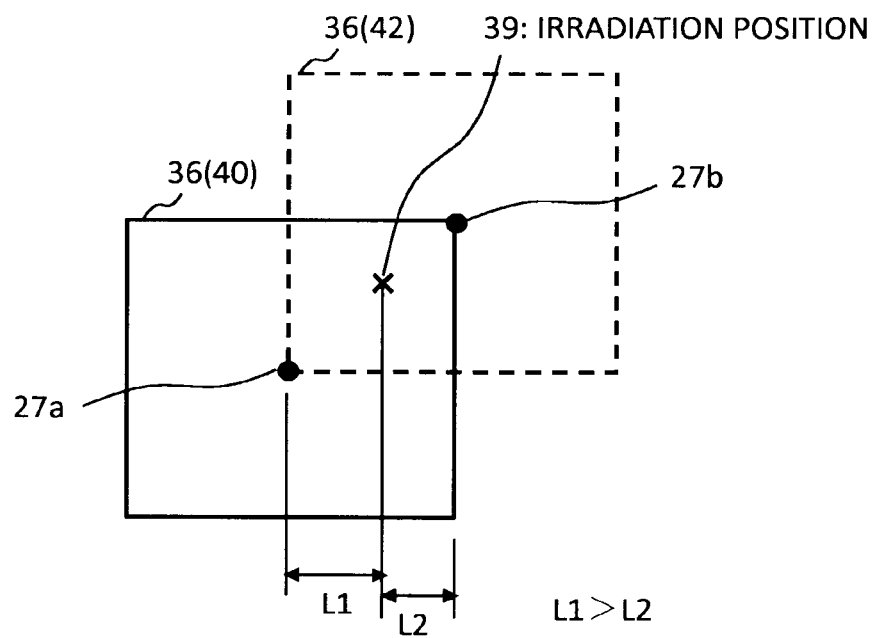

FIGS. 21A to 21C are illustrations showing examples of a bitmap according to the fifth embodiment. The example of FIG. 21A shows bitmap data used as a reference generated at the reference position in the rasterization step (S110), and bitmap data configured by meshes obtained by shifting, in the x and y directions, the reference position by a sub pixel equivalent to +5 nm. FIG. 21B shows bitmap data 40 used as a reference in which the center position (control grid 27) of each pixel is shown by the intersection of grid lines, and bitmap data 42 shifted by a sub pixel. The intersection of solid lines serves as a target position of a beam in the bitmap data 40 being a reference, and the intersection of dashed lines serves as a target position of a beam in the bitmap data 42 shifted by a sub pixel. In FIG. 21C, the center position of each pixel serves as a target position of a beam. It is supposed that when the surface of the target object is irradiated with a beam whose dose is based on a pattern area density ρ' defined for a control grid 27a in the bitmap data 40, the irradiation position 39 is shifted from the position of the control grid 27a by L1. In that case, by using the bitmap data 42 shifted in the direction of position deviation instead of the bitmap data 40, the position deviation amount between the irradiation position 39 of actual irradiation on the surface of the target object and the control grid 27b can be L2 smaller than L1. Although here described based on the positional relationship in the x direction, it is not limited thereto, and it can also be reduced with respect to the distance in the direction obliquely shifted. Since, as a pattern area density ρ' defined for the control grid 27b, a value after shifting is defined, the position deviation of a pattern can be reduced in accordance with the reduction of the position deviation of the irradiation position of a beam. Then, according to the fifth embodiment, data processing is performed using bitmap data in which position deviation is reduced for each block region.

In the bitmap assignment step (S106), the bitmap assignment unit 60 (bitmap assignment processing unit) assigns, for each block region, a plurality of bitmap data, where a pattern whose reference position is different from each other to be written in the stripe region 32 is arranged. For example, bitmap data whose reference position is (0, 0) without shifting, bitmap data shifted by (+5 nm and +5 nm), bitmap data shifted by (+5 nm and −5 nm), bitmap data shifted by (−5 nm and +5 nm), and bitmap data shifted by (−5 nm and −5 nm) are assigned to each block region.

In the bitmap selection step (S107), the bitmap selection unit 62 selects, for each block region, bitmap data whose maximum position deviation amount is the smallest from an assigned plurality of bitmap data in which the reference positions are different from each other.

Figure 22A:
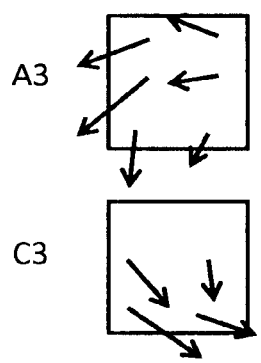
FIGS. 22A and 22B are illustrations showing examples of a range of a position deviation amount of each block region according to the fifth embodiment.
Figure 22A:
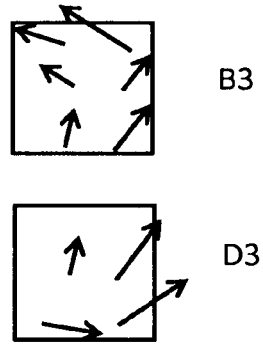
Figure 22B:
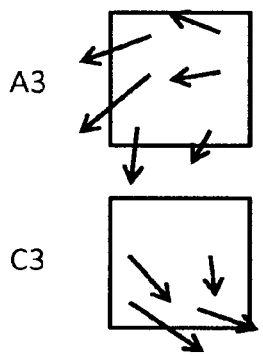
Figure 22B:
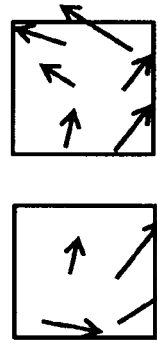

FIGS. 22A and 22B are illustrations showing examples of a range of a position deviation amount of each block region according to the fifth embodiment. FIG. 22A shows the range of the position deviation amount of each of the block regions 16, 17, 18, and 19 in the case where the range of the beam position deviation amount in the whole of the beam array region 10 is from −10 nm to +10 nm with respect to the x and y directions. For example, in the block region 16 of the region A3, a position deviation occurs in the range of −10 nm to 0 nm with respect to the x direction, and −10 nm to 0 nm with respect to the y direction. For example, in the block region 17 of the region B3, a position deviation occurs in the range of −10 nm to 0 nm with respect to the x direction, and 0 nm to +10 nm with respect to the y direction. For example, in the block region 18 of the region C3, a position deviation occurs in the range of 0 nm to +10 nm with respect to the x direction, and −10 nm to 0 nm with respect to the y direction. For example, in the block region 19 of the region D3, a position deviation occurs in the range of 0 nm to +10 nm with respect to the x direction, and 0 nm to +10 nm with respect to the y direction.

In the block region 16 of the region A3, by selecting the bitmap data shifted by (−5 nm, −5 nm), it is possible to adjust the position deviation to be in the range of −5 nm to +5 nm with respect to the x direction, and −5 nm to +5 nm with respect to the y direction as shown in FIG. 22B. Therefore, the maximum position deviation amount can be reduced to 5 nm from 10 nm.

In the block region 17 of the region B3, by selecting the bitmap data shifted by (−5 nm, +5 nm), it is possible to adjust the position deviation to be in the range of −5 nm to +5 nm with respect to the x direction, and −5 nm to +5 nm with respect to the y direction as shown in FIG. 22B. Therefore, the maximum position deviation amount can be reduced to 5 nm from 10 nm.

In the block region 18 of the region C3, by selecting the bitmap data shifted by (+5 nm, −5 nm), it is possible to adjust the position deviation to be in the range of −5 nm to +5 nm with respect to the x direction, and −5 nm to +5 nm with respect to the y direction as shown in FIG. 22B. Therefore, the maximum position deviation amount can be reduced to 5 nm from 10 nm.

In the block region 19 of the region D3, by selecting the bitmap data shifted by (+5 nm, +5 nm), it is possible to adjust the position deviation to be in the range of −5 nm to +5 nm with respect to the x direction, and −5 nm to +5 nm with respect to the y direction as shown in FIG. 22B. Therefore, the maximum position deviation amount can be reduced to 5 nm from 10 nm.

In the modulation rate calculation step (S108), the modulation rate calculation unit 59 (correction amount calculation unit) calculates, for each of the plurality of block regions 16, 17, 18 and 19, a modulation rate (factor) of a dose (irradiation amount) being a correction amount for each beam to correct a position deviation of a pattern written with a plurality of beams to be applied to the block region concerned, in the case of writing the stripe region 32 of the target object 101 in a manner of covering it by connecting the same block regions. Then, a modulation rate is calculated using the reduced position deviation amount due to a selected bitmap data.

By using bitmap data for which shift processing has been performed, the maximum position deviation amount can be reduced, and therefore, the maximum position deviation amount generated at the border position in the case of connecting the same block regions can be further reduced.

The contents of the dose calculation step (S116) are the same as those of the first embodiment. However, a dose map is generated for each block region using selected bitmap data. The contents of the dose calculation step (S120) for each block pass and the irradiation time calculation step (S122) are the same as those of the first embodiment. The contents of the multiple writing step (S124) are the same as those of the third embodiment.

In the examples described above, both of the multiple writing performed without shifting the position of the stripe region 32 and the multiple writing performed while shifting the position of the stripe region 32 are executed. The configuration has been described where the position deviation amount for each block region is reduced using a shifted bitmap in such a case. However, application of the shifted bitmap is not limited to this. For example, as described in the first embodiment, with respect to a plurality of block regions 12 and 13 obtained by dividing (by a perpendicular or vertical line), in the x direction, the beam array region 10, it is also preferable to reduce the position deviation amount for each block region by using a shifted bitmap in the case of performing multiple writing without shifting the position of the stripe region 32. Alternatively, as described in the second embodiment, with respect to a plurality of block regions 14 and 15 obtained by dividing (by a lateral or horizontal line), in the y direction, the beam array region 10, it is also preferable to reduce the position deviation amount for each block region by using a shifted bitmap in the case of performing multiple writing while shifting the position of the stripe region 32. Alternatively, it is also preferable to apply each block region by using a shifted bitmap in the fifth embodiment to the fourth embodiment.

Alternatively, with respect to a plurality of block regions 16, 17, 18, and 19 obtained by combining the configuration of dividing (by a perpendicular or vertical line) in the x direction the beam array region 10, and the configuration of dividing (by a lateral or horizontal line) in the y direction the beam array region 10, one block group may be configured by the block regions 16 and 18, and another block group may be configured by the block regions 17 and 19. Then, multiple writing may be performed without shifting the position of the stripe region 32 such that the stripe region 32 of the target object 101 is covered by connecting the same block groups. When performing this multiple writing, it is also preferable to reduce the position deviation amount for each block region by using a shifted bitmap. Alternatively, one block group may be configured by the block regions 16 and 17, and another block group may be configured by the block regions 18 and 19. Then, multiple writing may be performed while shifting the position of the stripe region 32 such that the stripe region 32 of the target object 101 is covered by connecting the same block groups. When performing this multiple writing, it is also preferable to reduce the position deviation amount for each block region by using a shifted bitmap.

Embodiments have been explained referring to specific examples described above. However, the present invention is not limited to these specific examples. The above examples describe the case where each of the multiple beams 20 individually controls, for each beam, the irradiation time within the maximum irradiation time Ttr for one shot. However, it is not limited thereto. For example, the maximum irradiation time Ttr for one shot is divided into a plurality of sub-shots each having a different irradiation time. Then, for each beam, a combination of sub-shots is selected from the plurality of sub-shots in order that the combination may become the irradiation time for one shot.

It is also preferable to control, for each beam, the irradiation time for one shot by continuously applying the same beam irradiation to pixels whose combinations of selected sub-shots are the same as each other.

While the case of inputting a 10-bit control signal for controlling each control circuit 41 has been described above, the number of bits may be suitably set. For example, a 2-bit (or any one of 3 to 9 bit) control signal may be used. Alternatively, a control signal of 11 bits or more may be used. Further, when calculating, for each block region, a correction amount for each beam, it is also preferable to calculate the correction amount by correlating each block region in the state of the same block regions being connected to each other.

Further, in the case of dividing in the y direction as shown in FIG. 13, it is preferable to configure, for example, such that the height (size in the y direction) of each block region is equalized, and the y-direction shift amount of the stripe region 32 is obtained by multiplying the height (size in the y direction) of block region by n (n being an integer). Further, in the case of dividing in the x direction as shown in FIG. 10, it is preferable to equalize the width (size in the x direction) of each block region, for example.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam writing apparatus comprising:
 a beam forming mechanism configured to form multiple charged particle beams;
 a block region forming circuit configured to form a plurality of block regions from an irradiation region of the multiple charged particle beams which is formed by combining a plurality of sub-regions each surrounded by a beam, being different from each other, and a plurality of other beams adjacent to the beam in the multiple charged particle beams; and
 a writing mechanism configured to perform, using the multiple charged particle beams, multiple writing such that irradiation of each block region of the plurality of block regions is at least performed by any one of writing processing of the multiple writing, and such that each writing processing of the multiple writing is performed to write a writing region of a target object in a manner of covering the writing region without overlapping by, using one of the plurality of block regions, irradiation of the one of the plurality of block regions.

2. The apparatus according to claim 1 further comprising:
a correction amount calculation circuit configured to calculate, for the each block region of the plurality of block regions, a correction amount for each beam of a plurality of beams to be applied to a block region concerned to correct a position deviation of a pattern written with the plurality of beams in a case of writing the writing region of the target object in a manner of covering the writing region without overlapping by irradiating the block region concerned, wherein the writing mechanism performs, using the multiple charged particle beams corrected based on the correction amount for the each block region, the multiple writing such that irradiation of the each block region is at least performed by any one of writing processing of the multiple writing, and such that the each writing processing of the multiple writing is performed to write the writing region of the target object in a manner of covering the writing region without overlapping by, using one of the plurality of block regions, irradiation of the one of the plurality of block regions.

3. The apparatus according to claim 1, wherein the irradiation region is a rectangular region surrounded by a side of a first direction size obtained by multiplying a number of beams in a first direction of the multiple charged particle beams by a beam pitch in the first direction, and a side of a second direction size obtained by multiplying a number of beams in a second direction, orthogonal to the first direction, of the multiple charged particle beams by a beam pitch in the second direction.

4. The apparatus according to claim 1, further comprising:
a bitmap assignment processing unit configured to assign, for the each block region, a plurality of bitmap data where a pattern whose reference position is different from each other to be written in a writing region is arranged.

5. The apparatus according to claim 1, wherein a number of the plurality of block regions is determined using a multiplicity of a preset multiple writing performed without shifting a position of a writing region.

6. The apparatus according to claim 1, wherein a number of the plurality of block regions is determined using a multiplicity of a preset multiple writing performed while shifting a position of a writing region.

7. The apparatus according to claim 1, wherein the plurality of block regions is formed such that a space is formed between block regions.

8. A multi-charged particle beam writing method comprising:
forming multiple charged particle beams;
forming a plurality of block regions from an irradiation region of the multiple charged particle beams which is formed by combining a plurality of sub-regions each surrounded by a beam, being different from each other, and a plurality of other beams adjacent to the beam of the multiple charged particle beams; and
performing, using the multiple charged particle beams, multiple writing such that irradiation of each block region of the plurality of block regions is at least performed by any one of writing processing of the multiple writing, and such that each writing processing of the multiple writing is performed to write a writing region of a target object in a manner of covering the writing region without overlapping by, using one of the plurality of block regions, irradiation of the one of the plurality of block regions.

9. The method according to claim 8 further comprising:
calculating, for the each block region of the plurality of block regions, a correction amount for each beam of a plurality of beams to be applied to a block region concerned to correct a position deviation of a pattern written with the plurality of beams in a case of writing the writing region of the target object irradiating the block region concerned in a manner of covering the writing region without overlapping by irradiating the block region concerned, wherein the multiple writing is performed, using the multiple charged particle beams corrected based on the correction amount for the each block region, such that irradiation of the each block region is at least performed by any one of writing processing of the multiple writing, and such that the each writing processing of the multiple writing is performed to write the writing region of the target object in a manner of covering the writing region without overlapping by, using one of the plurality of block regions, irradiation of the one of the plurality of block regions.

10. The method according to claim 8, wherein the irradiation region is a rectangular region surrounded by a side of a first direction size obtained by multiplying a number of beams in a first direction of the multiple charged particle beams by a beam pitch in the first direction, and a side of a second direction size obtained by multiplying a number of beams in a second direction, orthogonal to the first direction, of the multiple charged particle beams by a beam pitch in the second direction.

* * * * *